US012562351B2

(12) United States Patent
Dash et al.

(10) Patent No.:    US 12,562,351 B2
(45) Date of Patent:    Feb. 24, 2026

(54) EXTREME EDGE SHEATH TUNABILITY WITH NON-MOVABLE EDGE RING

(71) Applicant: Applied Materials, Inc., Santa Clara, CA (US)

(72) Inventors: Shreeram Jyoti Dash, San Jose, CA (US); Peter Muraoka, Santa Clara, CA (US); Michael T. Nichols, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 93 days.

(21) Appl. No.: 18/427,509

(22) Filed: Jan. 30, 2024

(65) Prior Publication Data

US 2025/0246415 A1      Jul. 31, 2025

(51) Int. Cl.
*H01J 37/32* (2006.01)
*H01L 21/683* (2006.01)

(52) U.S. Cl.
CPC . *H01J 37/32642* (2013.01); *H01J 2237/3341* (2013.01)

(58) Field of Classification Search
None
See application file for complete search history.

(56) References Cited

U.S. PATENT DOCUMENTS 6,471,464 B1    10/2002    Fay et al.
6,709,547 B1     3/2004    Ni et al.

7,319,920 B2    1/2008    Donoso et al.
7,479,236 B2    1/2009    Chen et al.
7,933,009 B2    4/2011    Serebryanov et al.
8,060,330 B2    11/2011    O'Neill et al.
8,751,047 B2    6/2014    Rodnick et al.
9,852,889 B1    12/2017    Kellogg et al.
9,881,820 B2    1/2018    Wong et al.
10,541,168 B2    1/2020    Tan et al.
10,790,237 B2    9/2020    Mooring et al.
2017/0113355 A1    4/2017    Genetti et al.
(Continued)

FOREIGN PATENT DOCUMENTS

JP        H10-144774 A      5/1998
WO       2021021604 A1      2/2021
(Continued)

OTHER PUBLICATIONS

International Search Report and Written Opinion for PCT/US2024/055503 dated Feb. 27, 2025.
U.S. Appl. No. 18/218,579, filed Jul. 5, 2023.

*Primary Examiner* — Kenneth B Wells
(74) *Attorney, Agent, or Firm* — Patterson + Sheridan, LLP

(57)    ABSTRACT

Embodiments described herein generally related to a substrate processing apparatus. In one embodiment, a process kit for a substrate processing chamber disclosed herein. The process kit includes an edge ring configured to circumscribe a substrate in the semiconductor processing chamber, at least one conductive pin electrically coupled to the edge ring, a sliding ring positioned beneath the edge ring and comprising at least one insert hole for receiving the at least one conductive, and an actuator operable to displace the sliding ring relative to the at least one conductive pin along a direction that changes an amount of capacitive coupling between the at least one conductive pin and the sliding ring.

19 Claims, 15 Drawing Sheets

(56) References Cited

U.S. PATENT DOCUMENTS

| | | | |
|---|---|---|---|
| 2017/0115657 A1 | 4/2017 | Trussell et al. | |
| 2017/0117172 A1 | 4/2017 | Genetti et al. | |
| 2017/0236688 A1 | 8/2017 | Caron et al. | |
| 2017/0236741 A1 | 8/2017 | Angelov et al. | |
| 2017/0236743 A1 | 8/2017 | Severson et al. | |
| 2017/0263478 A1 | 9/2017 | McChesney et al. | |
| 2017/0287682 A1 | 10/2017 | Musselman et al. | |
| 2018/0019107 A1 | 1/2018 | Ishizawa | |
| 2018/0090354 A1 | 3/2018 | Sugita et al. | |
| 2018/0166259 A1 | 6/2018 | Ueda | |
| 2018/0233328 A1 | 8/2018 | Ueda et al. | |
| 2018/0277416 A1 | 9/2018 | Takahashi et al. | |
| 2018/0301322 A1 | 10/2018 | Sugita et al. | |
| 2018/0315640 A1 | 11/2018 | Ueda et al. | |
| 2019/0172688 A1 | 6/2019 | Ueda | |
| 2019/0333785 A1 | 10/2019 | Tanikawa | |
| 2020/0234928 A1* | 7/2020 | Vishwanath | H01L 21/68742 |
| 2020/0234981 A1 | 7/2020 | Schmid et al. | |
| 2021/0005502 A1 | 1/2021 | Wagatsuma et al. | |
| 2021/0013014 A1* | 1/2021 | Sarode Vishwanath | H01L 21/3065 |
| 2021/0043431 A1 | 2/2021 | Bin Budiman et al. | |
| 2021/0166960 A1 | 6/2021 | Sugita et al. | |
| 2021/0254957 A1* | 8/2021 | Ghantasala | G01B 7/02 |
| 2021/0257234 A1 | 8/2021 | Akiduki | |
| 2023/0369026 A1* | 11/2023 | Kimball | H01J 37/32651 |
| 2024/0429089 A1* | 12/2024 | Muraoka | H01L 21/68721 |
| 2025/0014878 A1* | 1/2025 | Schmid | H01J 37/347 |

FOREIGN PATENT DOCUMENTS

| | | |
|---|---|---|
| WO | 2021022291 A1 | 2/2021 |
| WO | 2021108178 A1 | 6/2021 |
| WO | 2021173498 A1 | 9/2021 |
| WO | 2021194468 A1 | 9/2021 |

* cited by examiner

FIG. 12A
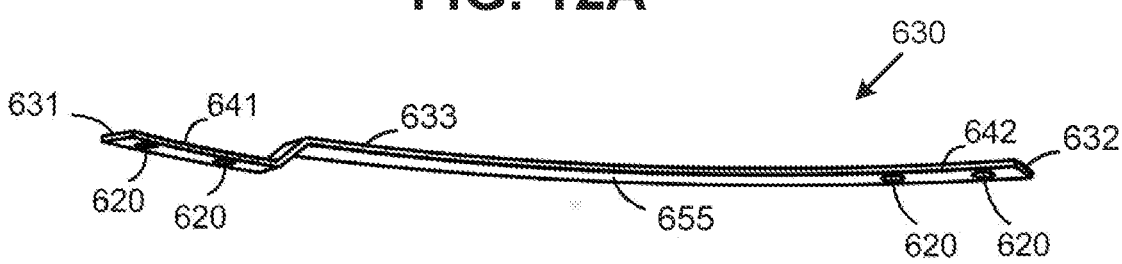
FIG. 12B
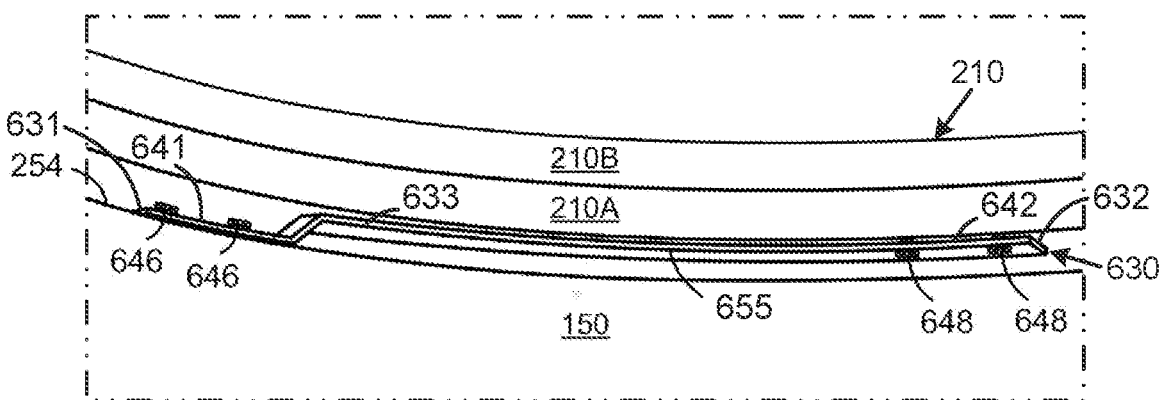
FIG. 12C
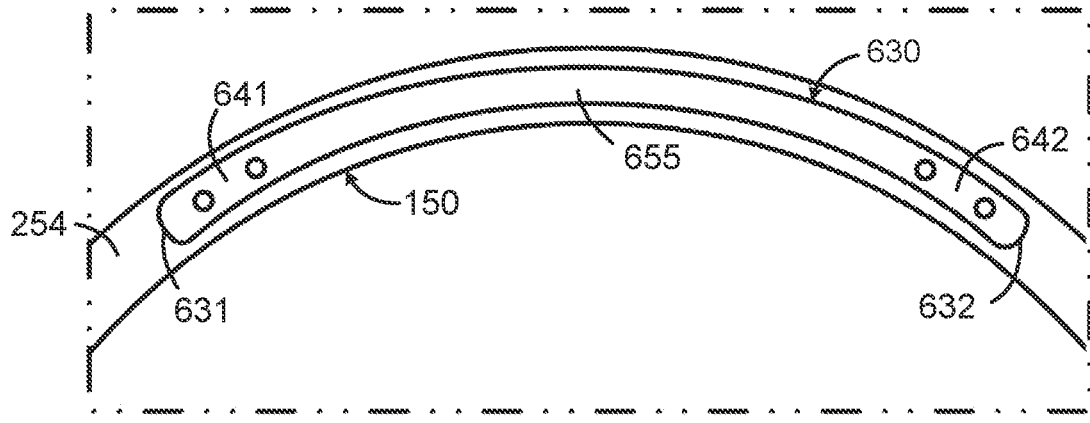

Fig. 13

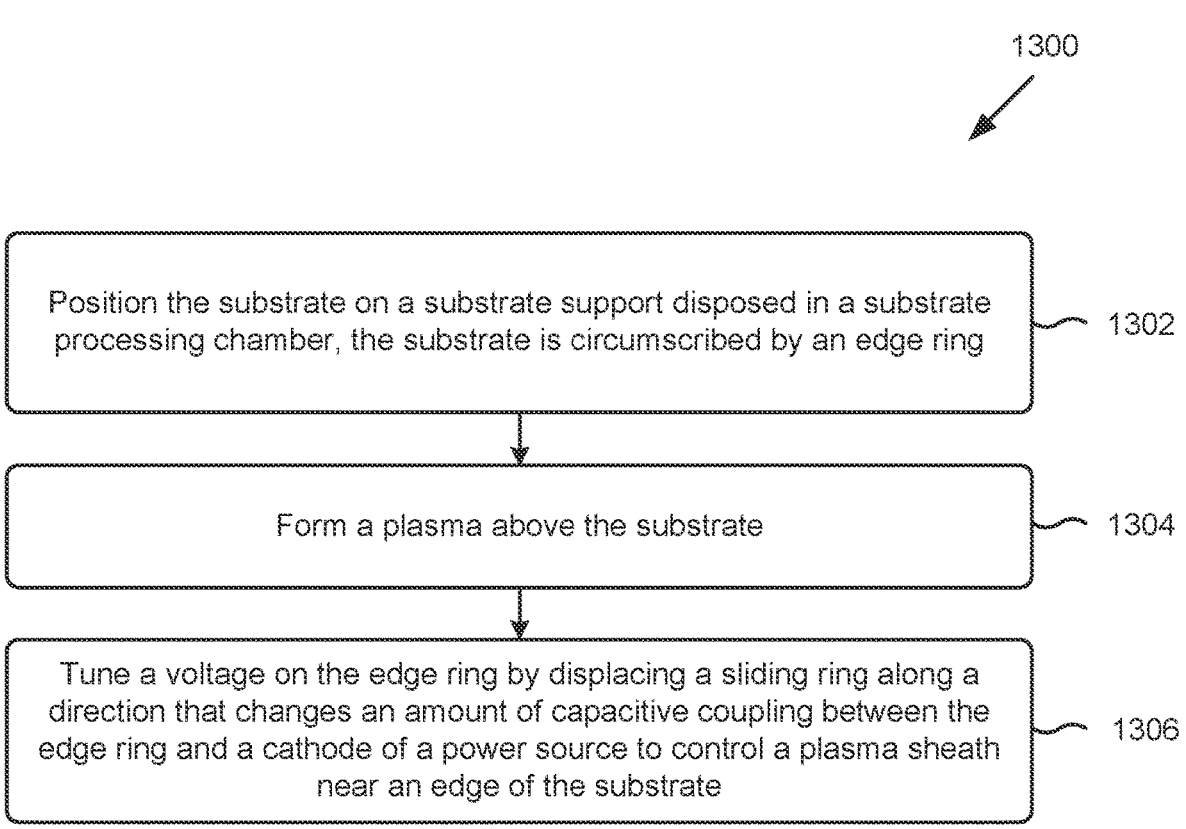

1300

Position the substrate on a substrate support disposed in a substrate processing chamber, the substrate is circumscribed by an edge ring — 1302

Form a plasma above the substrate — 1304

Tune a voltage on the edge ring by displacing a sliding ring along a direction that changes an amount of capacitive coupling between the edge ring and a cathode of a power source to control a plasma sheath near an edge of the substrate — 1306

EXTREME EDGE SHEATH TUNABILITY WITH NON-MOVABLE EDGE RING

BACKGROUND

Field

Embodiments described herein generally relate to a substrate processing apparatus, and more specifically to an improved apparatus for controlling a plasma edge profile for processing substrates.

Description of the Related Art

As semiconductor technology nodes advanced with reduced size device geometries, substrate edge critical dimension uniformity requirements become more stringent and affect die yields. Commercial plasma reactors include multiple tunable knobs for controlling process uniformity across a substrate, such as, for example, temperature, gas flow, direct current (DC) power, and the like. Typically, in etch processes, silicon substrates are etched while electrostatically clamped to an electrostatic chuck.

During processing, a substrate resting on a substrate support may undergo a process that deposits material on the substrate and to remove, or etch, portions of the material from the substrate, often in succession or in alternating processes. It is typically beneficial to have uniform deposition and etching rates across the surface of the substrate. However, process non-uniformities often exist across the surface of the substrate and may be significant at the perimeter or edge of the substrate. These non-uniformities at the perimeter may be attributable to electric field termination effects and are sometimes referred to as edge effects. Previous methods for compensating the edge effects include providing a deposition ring around a substrate and physically moving the deposition ring with respect to the substrate to influence the plasma sheath at the edge of the substrate. For example, the deposition ring may be raised with respect to the substrate to bend the plasma sheath to focus ions toward or away from the edge. One of the problems with the movable deposition ring is particle generation. Particles from the movable deposition ring may alter the process chemistry and/or cause undesirable contamination in the processing chamber.

Accordingly, there is a continual need for an improved apparatus for a substrate processing.

SUMMARY

Embodiments described herein generally relate to a substrate processing apparatus, process kit and methods for using the same.

In one example, a process kit for a substrate processing chamber is disclosed herein. The process kit includes an edge ring configured to circumscribe a substrate in the semiconductor processing chamber, at least one conductive pin electrically coupled to the edge ring, a sliding ring positioned beneath the edge ring and comprising at least one insert hole for receiving the at least one conductive, and an actuator operable to displace the sliding ring relative to the at least one conductive pin along a direction that changes an amount of capacitive coupling between the at least one conductive pin and the sliding ring.

In another example, a process kit for a substrate processing chamber is disclosed herein. The process kit includes an edge ring configured to circumscribe a substrate in the semiconductor processing chamber, a sliding ring positioned beneath the edge ring and electromechanically coupled to the edge ring through at least one coupling member, and an actuator operable to displace the sliding ring along a direction that changes an amount of capacitive coupling between the sliding ring and a baseplate supporting the substrate.

In another example, a method of processing a substrate is disclosed herein. The method includes positioning the substrate on a substrate support disposed in a substrate processing chamber, the substrate is circumscribed by an edge ring, forming a plasma above the substrate, and tuning a voltage on the edge ring by displacing a sliding ring along a direction that changes an amount of capacitive coupling between the edge ring and a cathode of a power source to control a plasma sheath near an edge of the substrate.

BRIEF DESCRIPTION OF THE DRAWINGS

So that the manner in which the above recited features of the present disclosure can be understood in detail, a more particular description of the present disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the present disclosure may admit to other equally effective embodiments.

FIGS. 2A-2C illustrate simplified cross sectional views of a portion of the processing chamber of FIG. 1A depicting a capacitive coupling configuration between a sliding ring and an edge ring, in accordance with certain embodiments of the present disclosure.

FIG. 5A illustrates a portion of the sliding ring shown in FIGS. 2A-2C, in accordance with one embodiment of the present disclosure.

FIG. 5B illustrates an enlarged portion of the sliding ring shown in FIG. 5A, in accordance with one embodiment of the present disclosure.

FIGS. 6A-6C illustrate simplified cross sectional views of a portion of the processing chamber of FIG. 1A depicting a capacitive coupling configuration between a substrate support and a sliding ring, in accordance with one embodiment of the present disclosure.

FIG. 12A illustrates a schematic diagram of a coupling member shown in FIGS. 6A-6C, in accordance with one embodiment of the present disclosure.

FIG. 12B illustrates a schematic diagram of the coupling member shown in FIG. 12A electromechanically coupled to a sliding ring and an edge ring, in accordance with one embodiment of the present disclosure.

FIG. 12C illustrates a top plan view of the coupling member positioned on a top surface of the sliding ring shown in FIG. 12B, in accordance with one embodiment of the present disclosure.

FIG. 13 illustrates a flowchart of a method for processing a substrate, in accordance with one embodiment of the present disclosure.

For clarity, identical reference numerals have been used, where applicable, to designate identical elements that are common between figures. Additionally, elements of one embodiment may be advantageously adapted for utilization in other embodiments described herein.

DETAILED DESCRIPTION

Embodiments of the present disclosure generally include methods and apparatuses that improve the etch rate uniformity across a surface of a substrate by controlling the shape of a plasma sheath formed across a substrate, such as a semiconductor wafer, during plasma processing. Embodiments of the present disclosure will include the adjustment of one or more plasma processing variables and/or the adjustment of the configuration of process kit hardware that is in close proximity to a substrate and/or supports the substrate during processing. Thus, the uniformity of the plasma sheath across the wafer surface can be controlled, thereby increasing wafer processing yield.

More specifically, according to one embodiment of the present disclosure, a process kit includes a non-movable edge ring and a sliding ring that is capacitively coupled to one or more conductive pins protruding from a bottom surface of the edge ring. The sliding ring is electrically coupled to the cathode of a power source (e.g., a single-output DC pulsed voltage source). The process kit is configured to displace (e.g., raise or lower) the sliding ring to change the amount of overlap between the powered sliding ring and the conductive pins that are electrically connected to the edge ring. The amount of capacitive coupling between the powered sliding ring and the conductive pins is proportional to the amount of overlap of the two components, and can be used to adjust or tune the voltage on the edge ring. As such, extreme edge sheath control can be achieved by controlling the amount of capacitive coupling between the powered sliding ring and the conductive pins, and without physically moving the edge ring.

According to another embodiment of the present disclosure, a process kit includes a non-movable edge ring and a sliding ring that is electromechanically connected to the edge ring through a conductive coupling member. The sliding ring is capacitively coupled to a baseplate (or a substrate support) in the process chamber, where the baseplate is electrically coupled to the cathode of a power source (e.g., a single-output DC pulsed voltage source). The process kit is configured to displace (e.g., raise or lower) the sliding ring to change the amount of overlap between the powered baseplate and the sliding ring that is electrically connected to the edge ring. The amount of capacitive coupling between the powered baseplate and the sliding ring is proportional to the amount of overlap of the two components, and can be used to adjust or tune the voltage on the edge ring. As such, extreme edge sheath control can be achieved by controlling the amount of capacitive coupling between the powered baseplate and the sliding ring, and without physically moving the edge ring.

Figure 1A:
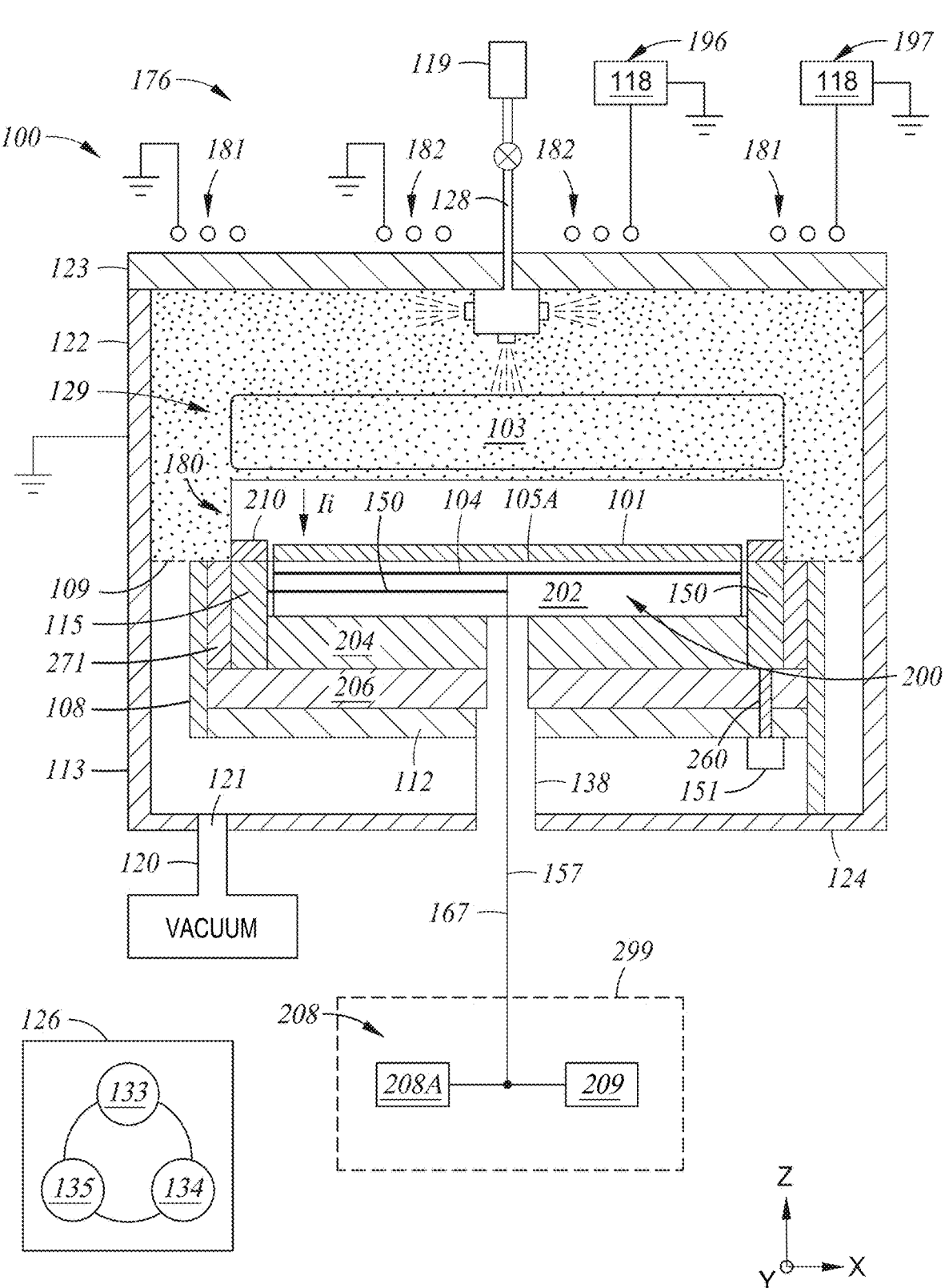
FIG. 1A illustrates a cross sectional view of a processing chamber, in accordance with one embodiment of the present disclosure.

FIG. 1A is a cross sectional view of a processing chamber 100, according to one embodiment. As shown, the processing chamber 100 is an etch chamber suitable for etching a substrate, such as a substrate 101. An example of a processing chamber that may be adapted to benefit from the present disclosure is a SYM3® Processing Chamber, commercially available from Applied Materials, Inc., located in Santa Clara, California. It is contemplated that other processing chambers, including deposition chambers and those from other manufacturers, may be adapted to benefit from the present disclosure.

The processing chamber 100 may be used for various plasma processes. In one embodiment, the processing chamber 100 may be used to perform dry etching with one or more etching agents. In one example, a plasma is formed in the processing chamber from a processing gas, such as $C_xF_y$, (where x and y can be different allowed combinations), $O_2$, $NF_3$, or combinations thereof.

The processing chamber 100 has a chamber body 113 and a system controller 126. The chamber body 113 includes a lid assembly 176, one or more sidewalls 122, and a chamber base 124, which collectively, with a chamber lid 123 of the lid assembly 176, define a processing volume 129. A substrate support assembly 180 is disposed in the processing volume 129.

The lid assembly 176 includes the chamber lid 123 and one or more plasma source assemblies, such as two inductively coupled plasma (ICP) assemblies 196, 197. Each ICP assembly 196, 197 includes a coil 181, 182, respectively, that is configured to inductively couple a radio frequency (RF) waveform generated by an RF generator 118 to a plasma 103 formed in the processing volume 129 of the processing chamber 100 during plasma processing. In this configuration, the chamber lid 123 includes a dielectric material that is configured to allow the fields generated by the coils 181, 182 during the delivery of an asymmetric voltage waveform by the RF generator 118 to help generate and sustain the plasma 103 in the processing volume 129.

The one or more sidewalls 122 and the chamber base 124 generally include materials that are sized and shaped to form the structural support for the elements of the processing chamber 100 and are configured to withstand the pressures and added energy applied to them while the plasma 103 is generated within a vacuum environment maintained in the processing volume 129 of the processing chamber 100 during processing. In one example, the one or more sidewalls 122 and the chamber base 124 are formed from a metal, such as aluminum, an aluminum alloy, or a stainless steel alloy.

A gas inlet 128 is disposed through the chamber lid 123. The gas inlet 128 is used to deliver one or more processing gases to the processing volume 129 from a processing gas source 119 that is in fluid communication therewith. A substrate 101 is loaded into, and removed from, the processing volume 129 through an opening (not shown) in one of the one or more sidewalls 122, which is sealed with a slit valve (not shown) during plasma processing of the substrate 101.

A vacuum system 120 is coupled to the vacuum port 121. The vacuum system 120 may include a vacuum pump and a throttle valve (not shown). The throttle valve regulates the flow of gases through the processing chamber 100. The vacuum pump is coupled to the vacuum port 121 disposed in the interior volume 108 to vacate gases through the vacuum port from the processing chamber 100.

The substrate support assembly 180, disposed in the processing volume 129, is configured to support the substrate 101 for processing. The substrate support assembly 180 may be coupled to a lift mechanism (not shown) through a shaft 138 which extends through the chamber base 124 of the chamber body 113. The lift mechanism may be flexibly sealed to the chamber body 113 by a bellows that prevents vacuum leakage from around the shaft 138. The lift mechanism allows the substrate support assembly 180 to be moved vertically within the chamber body 113 between a lower transfer portion and a number of raised process positions.

Three or more lift pins (not shown) may be disposed through the substrate support assembly 180. The three or more lift pins are configured to extend through the substrate support assembly 180 such that the substrate 101 may be raised off a substrate supporting surface 105A of the substrate support assembly 180. The three or more lift pins may be activated by a lift ring (not shown) that is coupled to a lift ring actuator (not shown) that is configured to raise and lower the lift ring and three or more lift pins relative to the substrate supporting surface 105A.

The substrate support assembly 180 includes a substrate support 202 (e.g., an electrostatic chuck (ESC) substrate support or a baseplate) and one or more lower electrodes, which are coupled to a plasma source, such as a capacitively coupled plasma (CCP) assemblies. In some embodiments, the substrate support 202 is formed of a dielectric material, such as a bulk sintered ceramic material, such as a corrosion-resistant metal oxide or metal nitride material, for example, aluminum oxide ($Al_2O_3$), aluminum nitride (AlN), titanium oxide (TiO), titanium nitride (TiN), yttrium oxide ($Y_2O_3$), mixtures thereof, or combinations thereof. In some embodiments, the substrate support 202 further includes a bias electrode 104 embedded in the dielectric material thereof.

The substrate support assembly 180 also includes a cooling plate 204, a base 206, and a ground plate 112. The base 206 is interposed between the cooling plate 204 and the ground plate 112. The ground plate 112 is interposed between the base 206 and the chamber base 124. The substrate support 202 is thermally coupled to and disposed on the cooling plate 204. In some embodiments, the cooling plate 204 is configured to regulate the temperature of the substrate support 202, and the substrate 101 disposed on the substrate support 202, during substrate processing. In some embodiments, the cooling plate 204 may include a plurality of cooling channels (not shown) for circulating coolant therethrough. The cooling plate 204 may be coupled to or engaged with the substrate support 202 by an adhesive or any suitable mechanism.

The substrate support assembly 180 also includes a process kit 200 supported on the substrate support assembly 180. The process kit 200 includes an edge ring 210 and a sliding ring 150. The process kit 200 may additionally include a support ring 214 (shown in FIG. 1B) and an outer ring 274 (shown in FIG. 1B). The support ring 214 may interface with the edge ring 210 and support the edge ring 210 on a top surface of the support ring 214. The sliding ring 150 is operable to move vertically up and down relative to the edge ring 210, while the edge ring 210 stays stationary. An actuating assembly 151 is coupled to and disposed below the sliding ring 150. The actuating assembly 151 may include three or more pins coupled to a linear actuator, such that the pins contact an underside of the sliding ring 150 to move the sliding ring 150 up and down. In an example, the actuating assembly 151 includes three or more actuators which work together to raise and lower the sliding ring 150 along the z-axis.

Figure 1B:
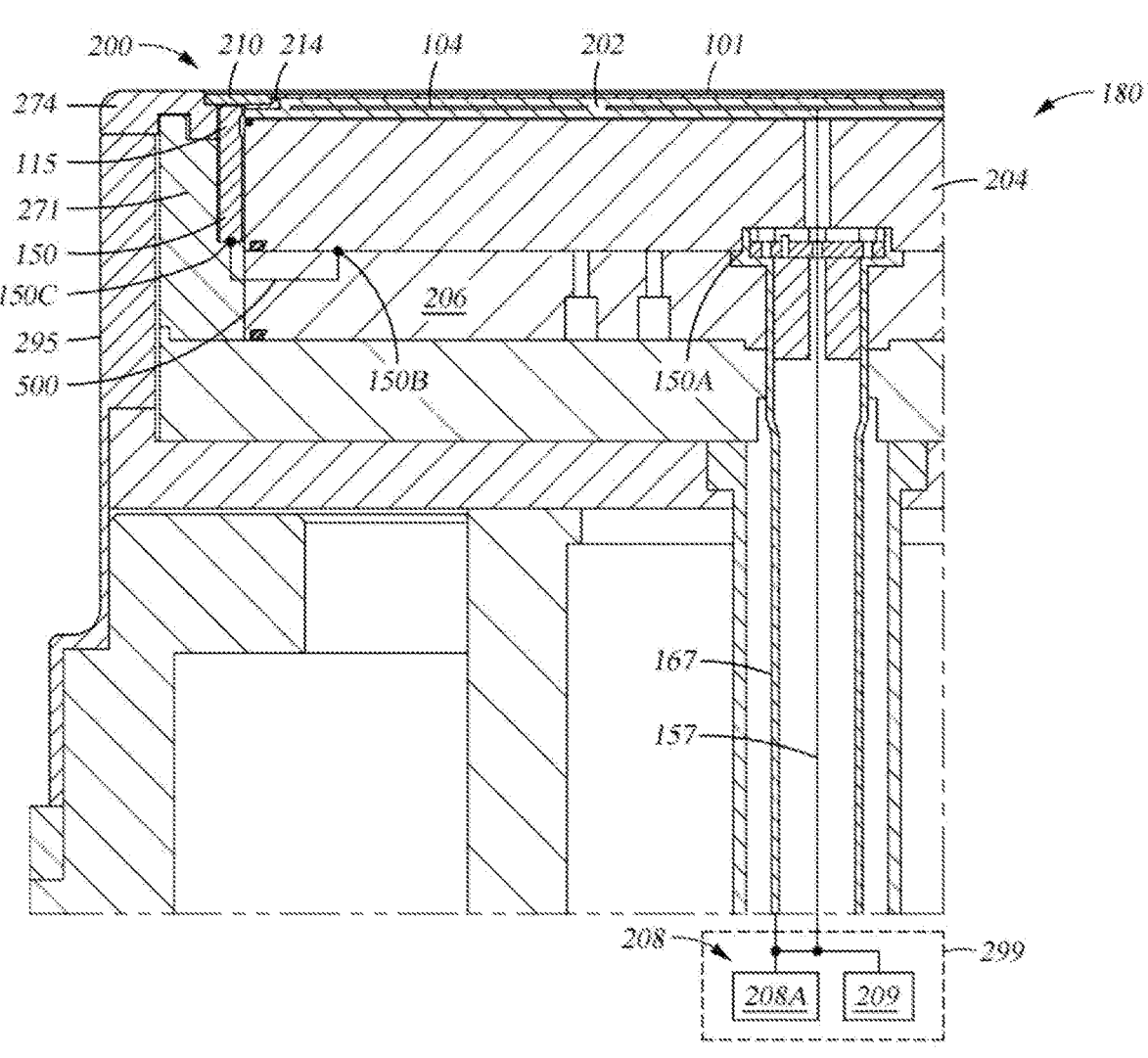
FIG. 1B illustrates an enlarged partial cross sectional view of a portion of the processing chamber of FIG. 1A, in accordance with one embodiment of the present disclosure.

Turning to FIG. 1B, FIG. 1B illustrates an enlarged partial cross sectional view of a portion of the processing chamber of FIG. 1A, according to one embodiment. The processing chamber 100 may include a biasing assembly 299 that can include one or more plasma source assemblies that are each adapted to deliver an asymmetric voltage waveform to one or more electrodes and/or one or more coils disposed within the processing chamber 100. The one or more lower electrodes can include the bias electrode 104 and/or the edge electrode 115 that are disposed within the process kit 200, and are coupled to one or more plasma source assemblies, such as waveform generation assemblies. For example, a waveform generation assembly 208 may be coupled by a transmission line 157 to the bias electrode 104. In some embodiments, the waveform generation assembly 208 is electrically coupled through a conductive tube 167 to the edge electrode 115, which can include the sliding ring 150. The waveform generation assembly 208 is configured to deliver a pulsed voltage (PV) waveform generated by a PV waveform generator, such as a PV waveform generator 208A to the plasma 103 formed in the processing volume 129 of the processing chamber 100 during plasma processing.

In one embodiment, the PV waveform generator 208A of the waveform generation assembly 208 is configured to bias both the bias electrode 104 and the edge electrode 115. The edge electrode 115 is capacitively coupled to the edge ring 210 through one or more conductive pins, when the PV waveform generator 208A is configured to bias both the bias electrode 104 and the edge electrode 115.

In another embodiment, the PV waveform generator 208A of the waveform generation assembly 208 is configured to bias the bias electrode 104, but not the edge electrode 115. The edge electrode 115 is electromechanically coupled to the edge ring 210 through one or more conductive coupling members (e.g., straps, flat springs, etc.), and is capacitively coupled to the bias electrode 104 in the substrate support 202, when the bias electrode 104 is biased by the PV waveform generator 208A.

In some embodiments, the PV waveform generator 208A is configured to deliver a plurality of asymmetric pulsed voltage waveforms to one or more electrodes within a plasma processing chamber to control and sustain a plasma formed in a processing region and/or control the formation of a sheath over the surface of a substrate during processing. The plasma processing methods and apparatus described herein are configured to improve the control of various characteristics of the generated plasma and control an ion energy distribution (IED) of the plasma generated ions that interact with one or more regions of a surface of a substrate during plasma processing. The ability to synchronize and control waveform characteristics, such as frequency, waveform shape and applied voltage on-time during a voltage waveform pulse provided in each of the pulsed voltage waveforms applied to the electrodes allows for an improved control of the generated plasma. As a result, greater precision for plasma processing can be achieved, which is described herein in more detail.

Figure 1C:
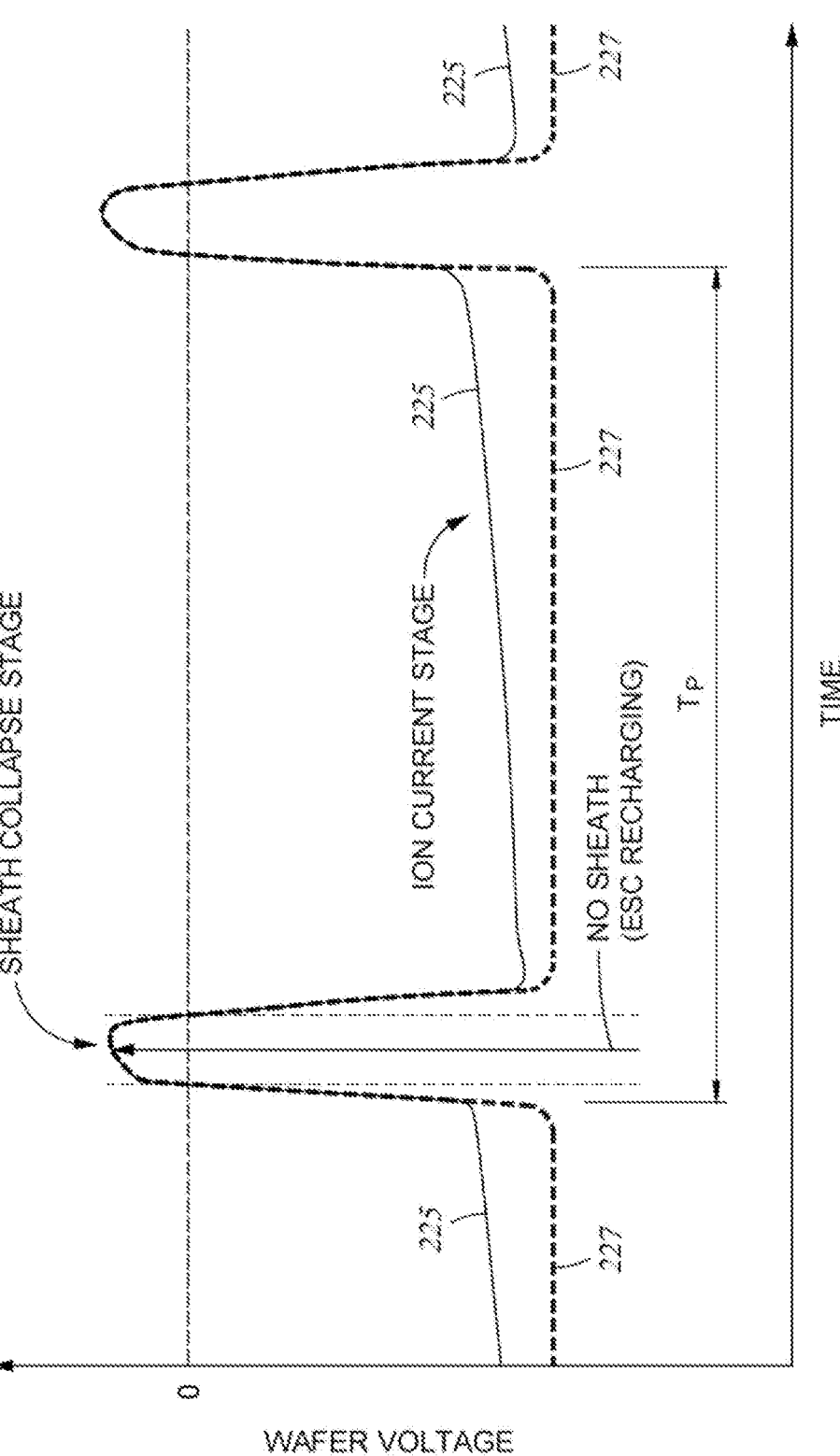
FIG. 1C illustrates a voltage waveform that is established on a substrate due to a voltage waveform applied to an electrode of a processing chamber, in accordance with one embodiment of the present disclosure.

FIG. 1C illustrates two separate voltage waveforms established at the substrate 101 disposed on the substrate supporting surface 105A of the substrate support assembly 180 of the processing chamber 100 due to the delivery of PV waveforms to the bias electrode 104 of the processing chamber 100. A first waveform (e.g., a waveform 225) is an example of a non-compensated PV waveform established at the substrate 101 during the plasma processing. A second waveform (e.g., a waveform 227) is an example of a compensated PV waveform established at the substrate 101 by applying a negative slope waveform to the bias electrode 104 of the processing chamber 100 during an "ion current stage" portion of the PV waveform cycle by use of the current source (not shown). The compensated PV waveform can alternatively be established by applying a negative voltage ramp during the ion current stage of the PV waveform generated by the PV waveform generator 208A.

The waveforms 225 and 227 include two main stages: an ion current stage and a sheath collapse stage. Both portions (e.g., the ion current stage and the sheath collapse stage) of the waveforms 225 and 227, can be alternately and/or separately established at the substrate 101 during the plasma processing. At a beginning of the ion current stage, a drop in the voltage at the substrate 101 is created, due to the delivery of a negative portion of the PV waveform (e.g., the ion current portion) provided to the bias electrode 104 by the PV waveform generator 208A, which creates a high voltage sheath above the substrate 101. The high voltage sheath allows the plasma generated positive ions to be accelerated towards the biased substrate 101 during the ion current stage, and thus, for RIE processes, controls the amount and characteristics of the etching process that occurs on the surface of the substrate 101 during the plasma processing. In some embodiments, it is desirable for the ion current stage to include a region of the PV waveform that achieves the voltage at the substrate 101 that is stable or minimally varying throughout the stage, as illustrated in FIG. 1C by the waveform 227. One will note that significant variations in the voltage established at the substrate 101 during the ion current stage, such as shown by the positive slope in the waveform 225, will undesirably cause a variation in the ion energy distribution (IED) and thus cause undesirable characteristics of the etched features to be formed in the substrate 101 during the RIE process.

Returning to FIGS. 1A and 1B, in one configuration, the bias electrode 104 is used as a chucking pole to secure (i.e., chuck) the substrate 101 to the substrate supporting surface 105A of the substrate support 202 and also to bias the substrate 101 with respect to the plasma 103 using one or more of the voltage waveform biasing schemes described herein. In some embodiments, the bias electrode 104 is formed of one or more electrically conductive parts, such as one or more metal meshes, foils, plates, or combinations thereof.

The biasing assembly 299 may also include a clamping network 209 so that a high voltage bias is applied to the bias electrode 104 and/or the edge electrode 115. In some embodiments, the bias electrode 104 is electrically coupled to the clamping network 209 and the edge electrode 115 is electrically coupled to a separate clamping network (not shown). The clamping network, by use of a high voltage DC power source, provides a chucking voltage to the bias electrode 104 and/or edge electrode 115, such as static DC voltage between about −5000 V and about +5000 V.

In some embodiments, the edge electrode 115 is positioned beneath the edge of the substrate and is disposed a distance from a center of the bias electrode 104. For a processing chamber 100 that is configured to process circular substrates, the edge electrode 115 is annular in shape, and is made from a conductive material. The sliding ring 150 is positioned beneath the edge ring 210, and is movable to surround at least a portion of the bias electrode 104 in the substrate support 202 when viewed in a direction normal to the substrate supporting surface 105A.

In some embodiments, for example as shown in FIGS. 2A-2C, 3, and 4A-4C, the edge electrode 115 includes a sliding ring 150 having one or more insert holes, each of which receives a dielectric insert. Each dielectric insert includes a clearance through-hole to allow a conductive pin, extending from a bottom surface of the edge ring 210, to extend into the dielectric insert without touching. The sliding ring 150 is configured to move vertically up and down to vary the amount of overlap with the conductive pins, such as from zero to 100 percent, while the edge ring 210 remains stationary. As such, the conductive pins can be capacitively coupled to the edge electrode 115, when the edge electrode 115 is biased by a power source. By moving the sliding ring 150 up and down along the z-axis, the amount of capacitive coupling between the conductive pins and the edge electrode 115 can be adjusted so that the voltage on the edge ring 210 can be tuned to control the sheath around the edge of the substrate 101 without physically moving the edge ring 210.

In some embodiments, for example as shown in FIGS. 6A-6C, 7, 8A-8C, 9A-9B, 10, and 11A-11C, the edge electrode 115 includes a sliding ring 150 having one or more conductive coupling members (e.g., arc segments, straps, flat springs, etc.) that are electromechanically coupled to the edge ring 210. The sliding ring 150 is configured to move vertically up and down to control the amount of overlap with the substrate support 202, while the substrate support 202 remains stationary. As such, the edge electrode 115 can be capacitively coupled to the bias electrode 104 in the substrate support 202, when the bias electrode 104 is biased by a power source. By moving the sliding ring 150 up and down along the z-axis, the amount of capacitive coupling between the bias electrode 104 and the edge electrode 115 can be adjusted so that the voltage on the edge ring 210 can tuned to control the sheath around the edge of the substrate 101 without physically moving the edge ring 210.

During operation, a PV waveform generator 208A is configured to provide a PV waveform to the chucking mesh (e.g., the bias electrode 104) on the substrate support 202. In some embodiments, the processing chamber 100 may include a biasing assembly 299 that is configured to provide improved delivery of a PV waveform to at least the electrodes disposed within the process kit 200, such as the bias electrode 104 and/or sliding ring 150. In some configurations, the biasing assembly 299 is provided to overcome the weak DC coupling to the electrodes in a plasma processing system.

In some embodiments of the biasing assembly 299, and in an effort to supply a PV waveform to the edge electrode 115, the PV waveform generator 208A is electrically coupled to the cooling plate 204 through the conductive tube 167 that is electrically coupled to an output of the PV waveform generator 208A. In general, the PV waveform generator 208A is a voltage waveform generating power supply that is used to control the sheath formation over the surface of the substrate during plasma processing.

In some embodiments, during processing, the PV waveform generator 208A of the biasing assembly 299 sends the voltage waveform, such as pulsed voltage waveform, to both the bias electrode 104 in the substrate support 202 and the cooling plate 204 simultaneously. The cooling plate 204 has an electromechanical coupling through a power coupling mechanism 500 (e.g., schematically shown in FIG. 1B) that is configured to provide the voltage waveform to the edge electrode 115, which can include the sliding ring 150. The power coupling mechanism 500 can include an electrically conductive cable, wire, strap or other flexible element that is configured to transfer the generated voltage waveform provided from the PV waveform generator 208A to a component within the edge electrode 115.

In one embodiment, the power coupling mechanism 500 includes a first end 150B that is coupled to the conductive tube 167 through a portion of the cooling plate 204, a second end 150C that is coupled to a portion of the edge electrode 115 (e.g., sliding ring 150), and a central section that is disposed within a channel (not shown) formed within the cooling plate 204 and/or the base 206. In another embodiment, the power coupling mechanism 500 includes a first end 150B that is coupled to the conductive tube 167 through a portion of the base 206, a second end 150C that is coupled to a portion of the edge electrode 115 (e.g., sliding ring 150), and a central section that is disposed within a channel (not shown) formed within the cooling plate 204 and/or base 206. The channel and central section of the power coupling mechanism 500 are configured to allow movement (e.g., bending, translation, etc.) of the power coupling mechanism 500 as the sliding ring 150 is displaced relative to the substrate supporting surface 105A by use of the actuating assembly 151 (shown in FIG. 1A). In yet another embodiment, the power coupling mechanism 500 includes a first end 150B that is directly coupled to the conductive tube 167, a second end 150C that is coupled to a portion of the edge electrode 115 (e.g., sliding ring 150), and a central section that is disposed within a channel (not shown) formed within the cooling plate 204 and/or base 206. The channel and central section of the power coupling mechanism 500 are configured to allow movement (e.g., bending, translation, etc.) of the power coupling mechanism 500 as the sliding ring 150 is displaced relative to the substrate supporting surface 105A by use of the actuating assembly 151 (shown FIG. 1A).

As schematically illustrated in FIG. 1B, the clamping network 209 can be coupled to the bias electrode 104 through the transmission line 157, and coupled to the edge electrode 115 through the power coupling mechanism 500, a portion of the cooling plate 204, or a portion of the base 206, and the conductive tube 167.

In one embodiment, the edge electrode 115 (having the sliding ring 150) is electromechanically coupled to the PV waveform generator 208A through the power coupling mechanism 500, which can include an electrically conductive cable, wire, strap or other flexible element that is configured to transfer the generated voltage waveform provided from the PV waveform generator 208A to the sliding ring 150. Because the sliding ring 150 can capacitively couple to the edge ring 210 through the conductive pins 292 (e.g., shown in FIGS. 2A-2C), the voltage on the edge ring 210 can be tuned by moving the sliding ring 150 along the z-axis relative to the conductive pins 292 to control the amount of capacitive coupling (e.g., capacitance) between the two components. In another embodiment, the bias electrode 104 in the substrate support 202 is capacitively coupled to (and physically separated from) the edge electrode 115 having the sliding ring 150, when the bias electrode 104 receives the generated voltage waveform provided from the PV waveform generator 208A. Because the edge ring 210 is electrically connected to the sliding ring 150, which is capacitively coupled to the bias electrode 104 in the substrate support 202, the voltage on the edge ring 210 can be tuned by moving the sliding ring 150 along the z-axis relative to the substrate support 202 to control the amount of capacitive coupling (e.g., capacitance) between the two components.

As shown in FIG. 1A, the system controller 126, also referred to herein as a processing chamber controller, operates to control the operations of processing chamber 100. For example, the system controller 126 may control the operations of the biasing assembly 299. The system controller 126 includes a central processing unit (CPU) 133, a memory 134, and support circuits 135. The system controller 126 is used to control the process sequence used to process the substrate 101, including the substrate biasing methods described herein. The CPU 133 is a general-purpose computer processor configured for use in an industrial setting for controlling the processing chamber and sub-processors related thereto. The memory 134 described herein, which is generally non-volatile memory, may include random access memory, read-only memory, floppy or hard disk drive, or other suitable forms of digital storage, local or remote. The support circuits 135 are conventionally coupled to the CPU 133 and comprise cache, clock circuits, input/output subsystems, power supplies, and the like, and combinations thereof. Software instructions (program) and data can be coded and stored within the memory 134 for instructing a processor within the CPU 133. A software program (or computer instructions) readable by the CPU 133 in the system controller 126 determines which tasks are performable by the components in the processing chamber 100. Typically, the software program, which is readable by the CPU 133 in the system controller 126, includes code, which, when executed by the processor (e.g., the CPU 133), performs tasks relating to the plasma processing methods described herein. The program may include instructions that are used to control the various hardware and electrical components within the processing chamber 100 to perform the various process tasks and various process sequences used to implement the methods described herein.

Figure 2A:
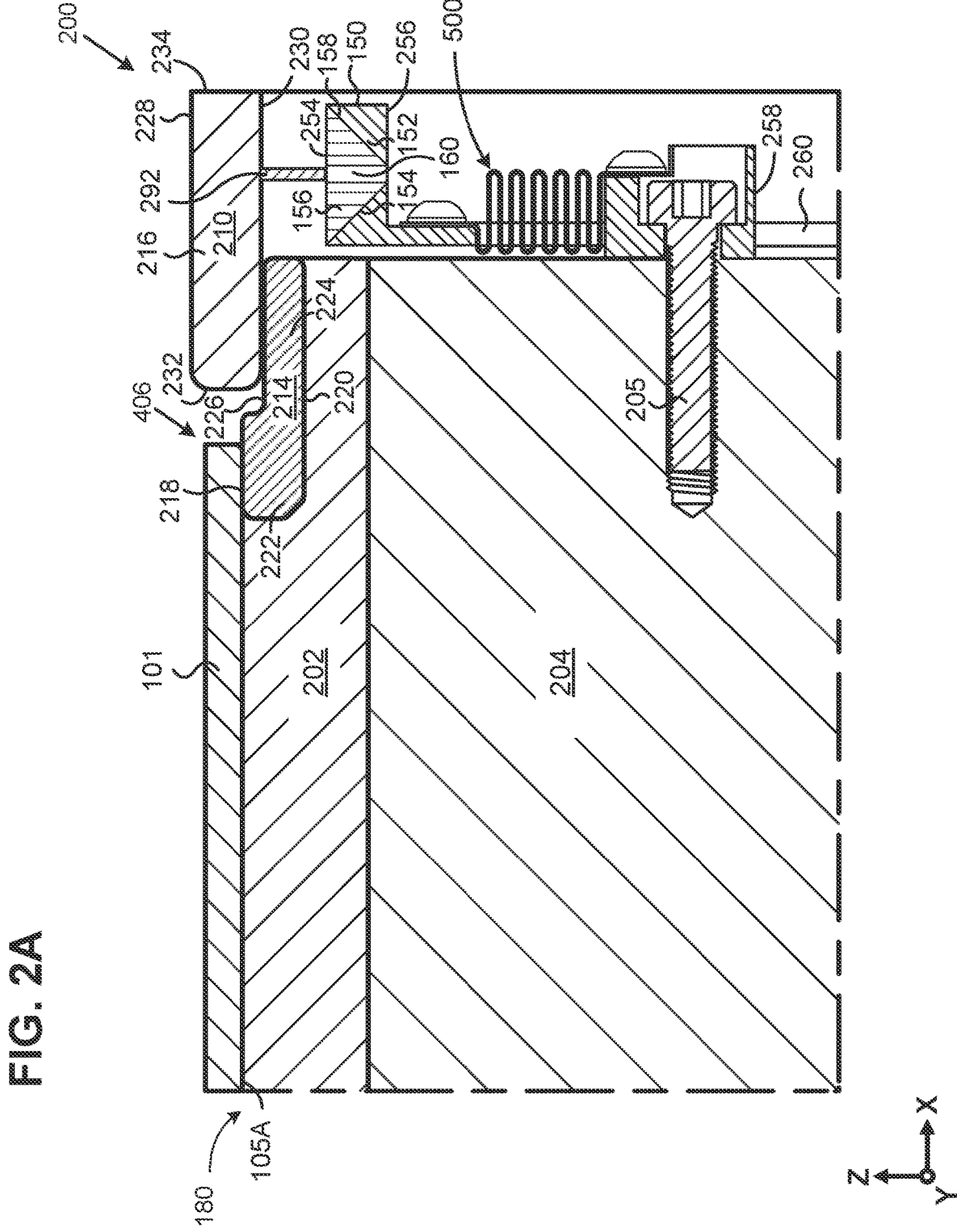
Figure 2B:
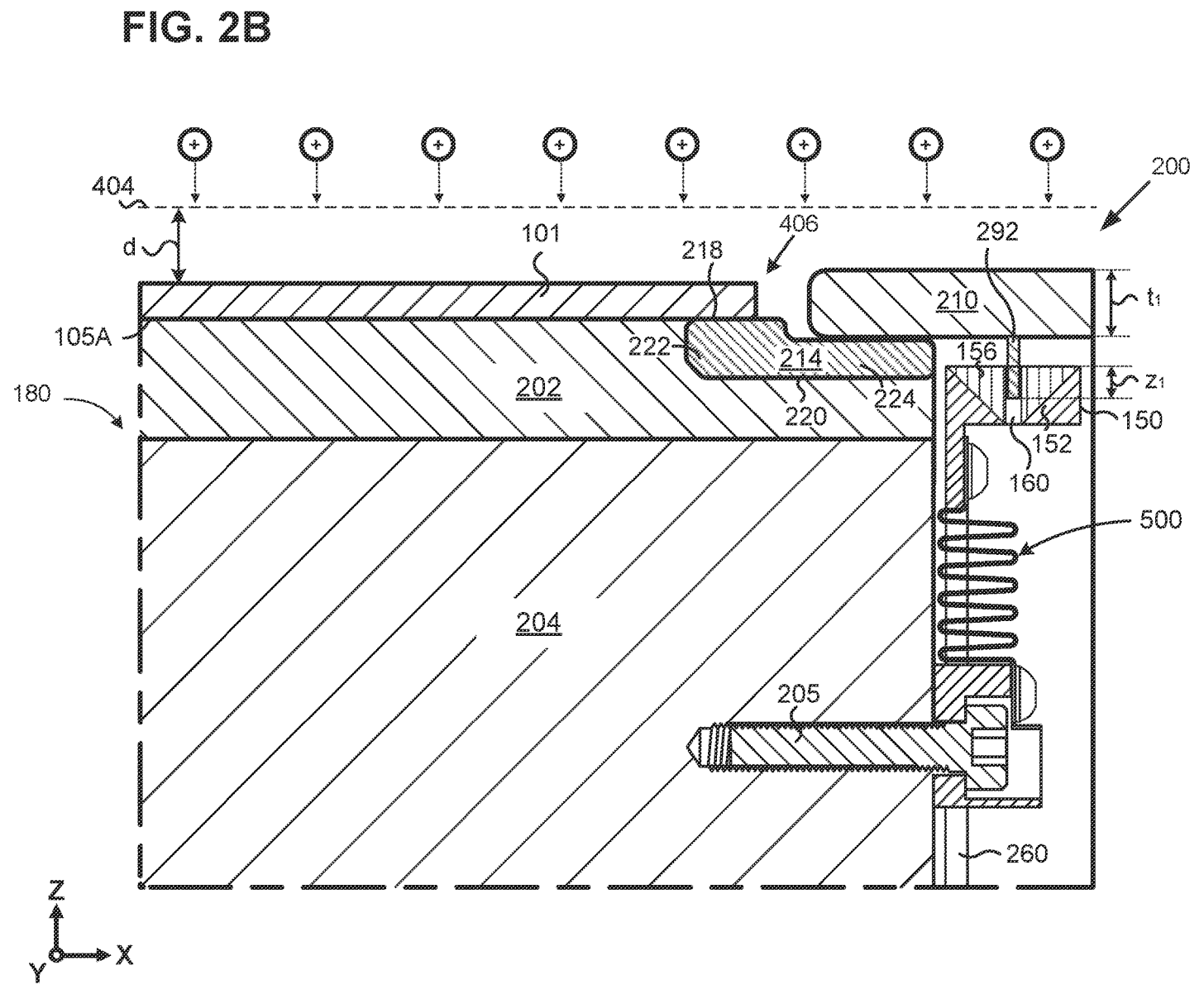
Figure 2C:
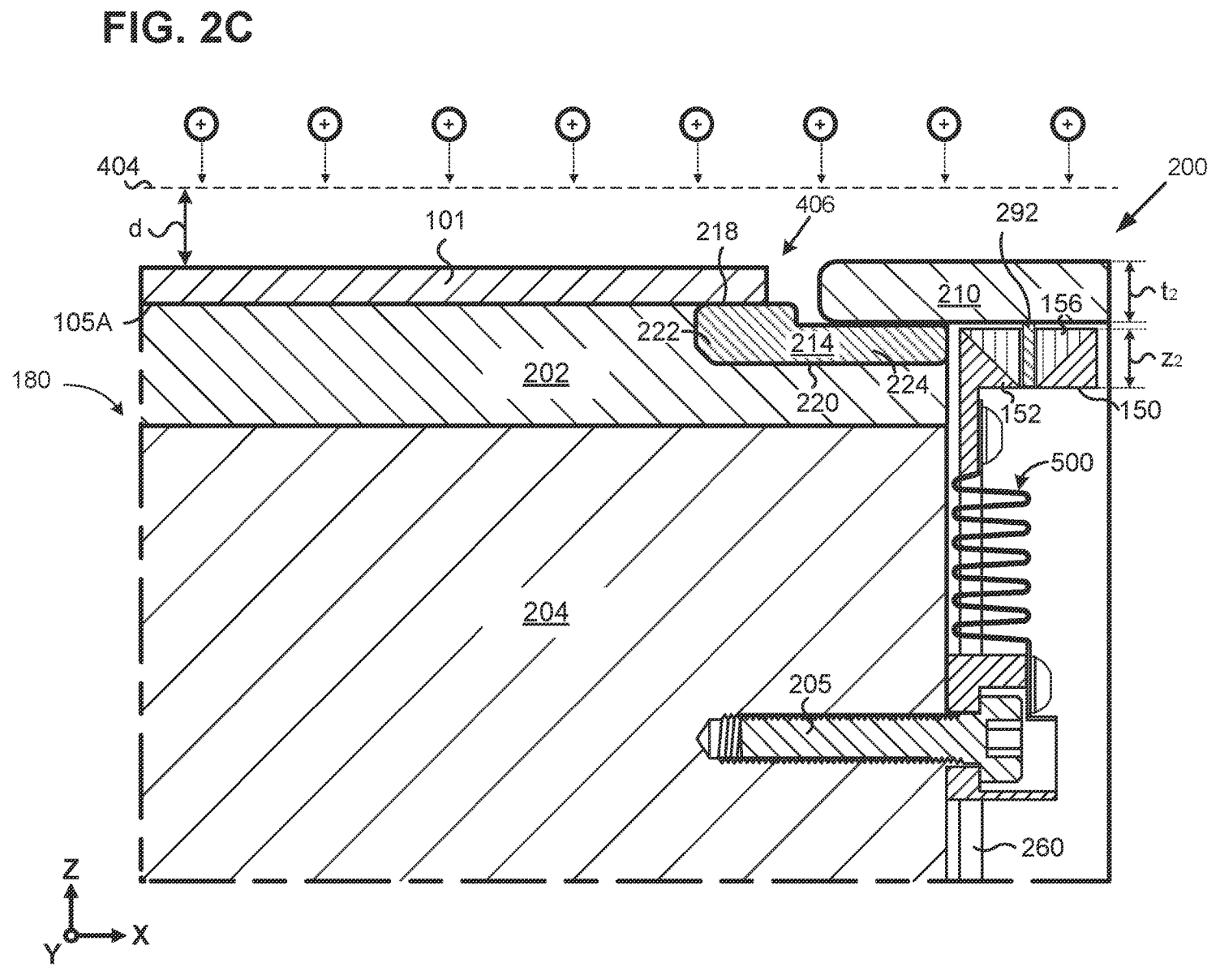

FIGS. 2A, 2B, and 2C illustrate simplified cross sectional views of a portion of the processing chamber of FIG. 1A depicting a capacitive coupling configuration between the sliding ring 150 and the conductive pins 292 for tuning a voltage on the edge ring 210, according to one embodiment.

As discussed above, the substrate support assembly 180 includes the substrate support 202, the cooling plate 204, and the base 206 (shown in FIG. 1A). The cooling plate 204 is disposed on the base 206. The cooling plate 204 may include a plurality of cooling channels (not shown) for circulating coolant therethrough. The cooling plate 204 may be engaged with the substrate support 202 by an adhesive or any suitable mechanism. The substrate support 202 may include one or more heaters (not shown). The one or more heaters may be independently controllable. The one or more heaters enable the substrate support 202 to heat the substrate 101 from a bottom surface of the substrate 101 to a desired temperature. The substrate support 202 may also include one or more bias electrodes (shown in FIG. 1A) embedded therein.

As shown in FIG. 2A, the process kit 200 is supported on the substrate support assembly 180, and includes the edge ring 210, the support ring 214, and the sliding ring 150. The support ring 214 and the edge ring 210 are interfaced with each other. The support ring 214 includes a top surface 218, a bottom surface 220, an inner edge 222, and an outer edge 224. The top surface 218 is substantially parallel to the bottom surface 220. The inner edge 222 is substantially parallel to the outer edge 224, and substantially perpendicular to the bottom surface 220. In some embodiments, the support ring 214 further includes a stepped surface 226. In the embodiment shown, the stepped surface 226 is formed in the outer edge 224, and is substantially parallel to the bottom surface 220. The stepped surface 226 defines a recess for receiving the edge ring 210. Generally, the height of the support ring 214 is limited by the height of the substrate support 202. For example, the inner edge 222 of the support ring 214 does not extend above the height of the substrate support 202. As such, the support ring 214 protects a side of the substrate support 202. In some embodiments, the substrate 101, when positioned on the substrate supporting surface 105A of the substrate support 202, extends partially over the support ring 214.

As shown in FIG. 2A, the edge ring 210 has a ring body 216, which includes a top surface 228, a bottom surface 230, an inner edge 232, and an outer edge 234. The top surface 228 is substantially parallel to the bottom surface 230. The inner edge 232 is substantially parallel to the outer edge 234 and substantially perpendicular to the bottom surface 230. In one embodiment, the edge ring 210 is interfaced with the support ring 214 via the bottom surface 230. For example, the bottom surface 230 of the edge ring 210 interfaces with the stepped surface 226 in the support ring 214. In another embodiment, the edge ring 210 may further include a stepped surface (not shown) that is formed in the inner edge 232, such that the stepped surface interfaces with the stepped surface 226 of the support ring 214. When interfaced with the support ring 214, the inner edge 232 of the edge ring 210 is spaced from the substrate 101.

In one embodiment, when interfaced, the edge ring 210 and the support ring 214 form a continuous bottom surface. In another embodiment, when interfaced, the support ring 214 and the edge ring 210 do not form a continuous bottom surface. Rather, in some embodiments, the top surface 218 of the support ring 214 may be higher than the top surface 228 of the edge ring 210. In other embodiments, the bottom surface 230 of the edge ring 210 may sit below the bottom surface 220 of the support ring 214. Thus, in some embodiments, the support ring 214 and the edge ring 210 do not form a continuous top or bottom surface.

In one embodiment, the edge ring 210 includes one or more conductive pins 292 extending from the bottom surface 230 of the edge ring 210. In one example, the edge ring 210 and/or the conductive pins 292 may be formed from silicon carbide (SiC). In other examples, the edge ring 210 and/or the conductive pins 292 may be formed from other suitable conductive materials.

As illustrated in FIG. 2A, the sliding ring 150 may include a sliding electrode 152 having a conductive material such as a metal that can include aluminum, stainless steel, copper, nickel, or other suitable conductive material. The sliding ring 150 has one or more insert holes 154 that extend from a top surface 254 to a bottom surface 256 of the sliding ring 150. In some embodiments, each insert hole 154 includes an inner sidewall 158, tapered toward the bottom surface 256, for receiving a dielectric insert 156. In some embodiments, each dielectric insert 156 has an inverted conical shape that conforms to the tapered inner sidewall 158 of the insert hole 154. In one example, the dielectric inserts 156 can be formed by coating the insert holes 154 with a ceramic material. Each dielectric insert 156 includes a clearance through-hole 160 that extends through the entire height (e.g., along the z-axis) of the dielectric insert 156, such that the conductive pin 292 can pass through the clearance through-hole 160 without making contact with the conductive material in the sliding electrode 152, when the sliding ring 150 is displaced up and down along the z-axis. The tapered inner sidewalls 158 of insert holes 154 allow the dielectric inserts 156 to have varying thicknesses at different depths. As a result, the capacitive coupling between the sliding electrode 152 and the conductive pin 292 can be tuned with high precision given the varying dielectric thicknesses at different insertion depths.

As shown in FIG. 2A, the sliding ring 150 is situated beneath the conductive pin 292, where the sliding electrode 152 does not overlap the conductive pin 292 along the z-axis. Thus, the conductive pin 292 is not capacitively coupled to the sliding ring 150 in FIG. 2A. As shown in FIGS. 2B and 2C, the sliding ring 150 is displaced to partially and fully, respectively, engage (or overlap) with the conductive pin 292. As a result of the overlap between the conductive pin 292 and the sliding ring 150 along the z-axis, the conductive pin 292 is capacitively coupled to the sliding ring 150. In one embodiment, the sliding ring 150 has a height (e.g., along the z-axis) substantially equal to the height of the conductive pin 292. In another embodiment, the sliding ring 150 may have a height that is greater or less than the height of the conductive pin 292. The sliding ring 150 is configured to move toward and away from the edge ring 210 without making physical contact with the edge ring 210 and the conductive pin 292.

In some embodiments, the power coupling mechanism 500 enables the sliding ring 150 to be biased by providing a source power (e.g., PV waveform provided from the PV waveform generator 208A and/or DC bias provided from the DC power source in the clamping network 209) through the cooling plate 204. In some embodiments, the power coupling mechanism 500 enables the sliding ring 150 to be biased from the base 206 (shown in FIG. 1A). It should be appreciated that the power coupling mechanism 500 enables the sliding ring 150 to be electrically coupled to the cathode (e.g., the cooling plate 204 or alternatively described as the base 206, or even the conductive tube 167 shown in FIG. 1B). As the sliding ring 150 is biased by the source power, the amount of capacitive coupling between the conductive pin 292 and the sliding ring 150 can be controlled by moving the sliding ring 150 along the z-axis, which in turn tunes the voltage on the edge ring 210.

As shown in FIGS. 2A-2C, a lift pin 260 is operably coupled with the sliding ring 150 at an underside 258 of the sliding ring 150. For example, the lift pin 260 may be driven by the actuating assembly 151 (shown in FIG. 1A), which can include a pneumatic actuator or electric motor driven actuator assembly. In some embodiments, the lift pin 260 may be driven by a lift pin actuating mechanism (not shown) independent from the actuating assembly 151. The actuating assembly 151 allows the sliding ring 150 to be moved and positioned vertically within the processing chamber 100. The actuating assembly 151 raises the sliding ring 150 to one or more vertical positions that can be controlled by the system controller 126. In the embodiment shown in FIGS. 2A-2C, the edge ring 210 remains stationary while the sliding ring 150 is displaced by the actuating assembly 151 to move up and down along the z-axis.

In another example, the sliding ring 150 may be moved manually, thus eliminating the need for the lift pin 260. The sliding ring 150 may include a cavity (not shown) and an access orifice formed therein. The cavity is formed down to a bottom of the sliding ring 150. The cavity is configured to house a lead screw (not shown). The lead screw may be turned to raise or lower the sliding ring 150 relative to the edge ring 210.

During substrate processing, a voltage bias (e.g., the PV waveform and/or bias provided from the clamping network 209) may be provided from the cooling plate 204, or cathode, to the sliding ring 150. The amount of power coupled to the sliding ring 150 is improved by the power coupling mechanism 500. The power coupling mechanism 500 prevents power variation when the sliding ring 150 moves up and down by providing direct contact (e.g., through electromechanical coupling) between the powered components.

As shown in FIG. 2B, in the case of an etch reactor, a plasma sheath 404 is formed between the plasma and the substrate 101 being etched, the chamber body 113 (shown in FIG. 1A), and every other part of the processing chamber 100 in contact with the plasma. The ions produced in a plasma are accelerated in the plasma sheath and move perpendicular to the boundary of the formed plasma sheath. The plasma sheath 404 is a thin region of strong electric fields formed by space charge that joins the body of the plasma to its material boundary. Mathematically, the sheath thickness d is represented by the Child-Langmuir equation:

$$d = \frac{2}{3}\left(\frac{\varepsilon}{i}\right)^{\frac{1}{2}}\left(\frac{2e}{m}\right)^{\frac{1}{4}}(V_p - V_{DC})^{\frac{3}{4}}, \qquad \text{Equation (1)}$$

where i is the ion current density, $\varepsilon$ is the permittivity of vacuum, e is the elementary electric charge, m is the ion mass, $V_p$ is the plasma potential, and $V_{DC}$ is the DC voltage, for example, applied to the substrate 101 and/or the edge ring 210.

By moving the sliding ring 150 along the z-axis relative to the conductive pin 292, the amount of capacitive coupling between the sliding electrode 152 and the conductive pin 292 can be adjusted so as to tune the voltage on the edge ring 210, which in turn controls the profile of the plasma sheath 404 near the edge 406 of the substrate 101 to compensate for critical dimension nonuniformity. In other words, controlling the amount of capacitive coupling between the sliding electrode 152 and the conductive pin 292 (that is connected to the edge ring 210) affects the voltage on the edge ring 210, which in turn affects the thickness, d, of the plasma sheath 404.

The sheath thickness d of the plasma sheath 404 may be measured with respect to the edge ring 210. For example, in the embodiment shown in FIG. 2B, the sliding ring 150 is raised by the actuating assembly 151 (shown in FIG. 1A) along the z-axis to partially engage with the conductive pin 292. The amount of overlap $z_1$ between the sliding electrode 152 of the sliding ring 150 and the conductive pin 292 results in the capacitive coupling between the sliding electrode 152 and conductive pin 292. In FIG. 2B, with the overlap between the sliding electrode 152 and the conductive pin 292 being $z_1$, the voltage on the edge ring 210 is tuned to match the voltage on the substrate 101 (e.g., at $V_{DC}$). As illustrated in FIG. 2B, the plasma sheath 404 has a uniform thickness near the edge 406 of the substrate 101. It is noted that, in FIG. 2B, the edge ring 210 has an initial thickness $t_1$.

As shown in FIG. 2C, the thickness of the edge ring 210 is reduced to thickness $t_2$ from its initial thickness $t_1$ shown in FIG. 2B, for example, due to erosion during plasma etching in the processing chamber. The voltage on the edge ring 210 can change (e.g., decrease) when the edge ring 210 erodes. For example, due to erosion, the voltage on the edge ring 210 can fall below the voltage on the substrate 101 (e.g., below $V_{DC}$), which can in turn affect the profile of the plasma sheath 404 near the edge 406 of the substrate 101.

To compensate for the change in voltage on the edge ring 210 and/or to maintain plasma sheath thickness uniformity near the edge 406 of the substrate 101, as shown in FIG. 2C, the sliding ring 150 is raised by the actuating assembly 151 (shown in FIG. 1A) through the lift pin 260 along the z-axis such that the conductive pin 292 is further (e.g., fully) inserted in the clearance through-hole 160, thereby fully engaged with the sliding electrode 152. The amount of overlap $z_2$ between the sliding electrode 152 and the conductive pin 292 results in an increased capacitive coupling between the two components as compared to the amount of capacitive coupling with overlap $z_1$ in FIG. 2B. The increased capacitive coupling tunes (e.g., increases) the voltage on the edge ring 210 to match the voltage on the substrate 101 (e.g., at $V_{DC}$). In other words, raising the sliding ring 150 increases the amount of capacitive coupling between the sliding electrode 152 and the conductive pin 292 so as to keep the voltage on the edge ring 210 equal to the voltage on the substrate 101, when the thickness of the sliding ring 150 is reduced, for example, due to etching. As illustrated in FIG. 2C, the profile of the plasma sheath 404 is kept uniform near the edge 406 of the substrate 101.

As shown in FIGS. 2A-2C, the capacitive coupling configuration can control and adjust the amount of capacitive coupling between the conductive pin 292 and the sliding electrode 152 to tune the voltage on the edge ring 210, for example, to match the voltage on the substrate 101 (e.g., at $V_{DC}$). Thus, the embodiment shown in FIGS. 2A-2C is able to achieve extreme edge sheath tunability without physically moving (e.g., raising or lowering) the edge ring 210. In other words, moving the sliding ring 150 relative to the conductive pins 292 of the stationary edge ring 210 affects the profile of the plasma sheath 404 near the edge 406 of the substrate 101, which in turn controls the direction of the ions that are accelerated through the sheath and to the surface of the substrate 101.

In configurations where a constant potential (e.g., $V_{DC}$) is applied, the sheath thickness d and shape of the plasma sheath 404 remain constant throughout the plasma process. In configurations where the bias applied to the sliding ring 150 is pulsed, the sheath thickness d, which is controlled during the ion current phase of each pulse, is controlled so that the thickness and shape of the plasma sheath 404 remains constant throughout the primary etch portion of the PV waveform.

As discussed above, in one embodiment, when the cooling plate 204 is energized, the sliding ring 150 is electrically coupled to the cooling plate 204 through the power coupling mechanism 500. In another embodiment, the sliding ring 150 is electrically coupled through the power coupling mechanism 500 to the base 206. For example, the base 206 or the cooling plate 204 can be configured to supply the bias voltage to the sliding ring 150. As the sliding ring 150 is movable with respect to both the base 206 and the cooling plate 204 of the substrate support assembly 180, the power coupling mechanism 500 is configured to provide a direct connection between the sliding ring 150 and the substrate support assembly 180. As illustrated in FIGS. 2A-2C, the power coupling mechanism 500 is mechanically fastened to the cooling plate 204. For example, a fastener 205, such as a bolt, may attach the power coupling mechanism 500 mechanically fastened to the cooling plate 204. The power coupling mechanism 500 makes a physical electrical connection for which biasing voltage can travel between the sliding ring 150 and the cathode. In another embodiment, the power coupling mechanism 500 is mechanically fastened to the base 206 using the fastener 205.

Figure 3:
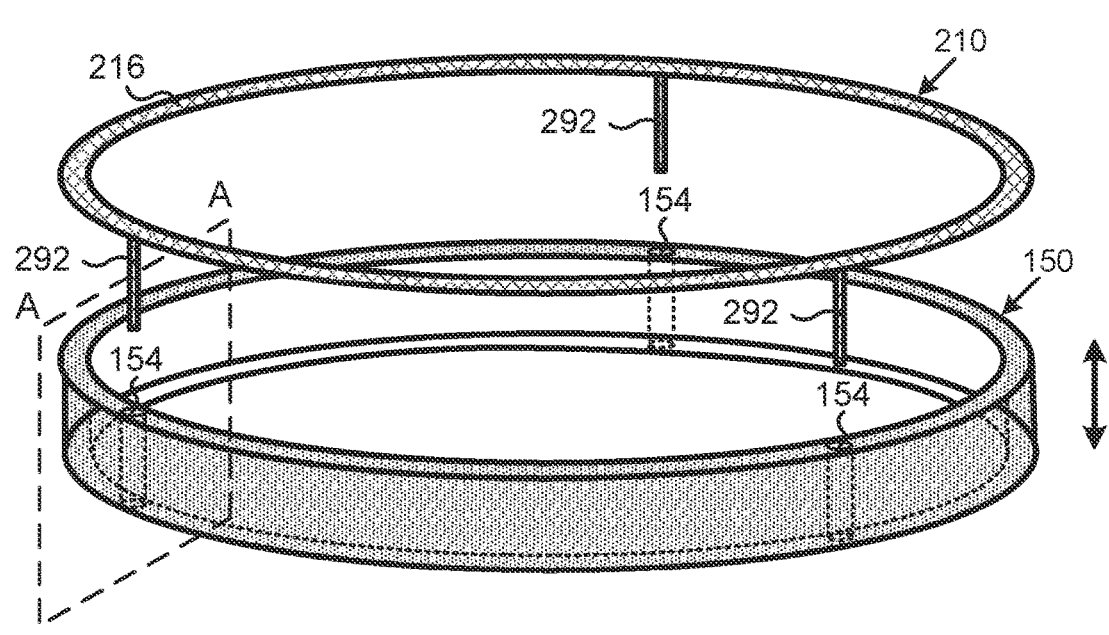
FIG. 3 illustrates a simplified schematic view of the sliding ring and the edge ring in FIG. 2A, in accordance with one embodiment of the present disclosure.

FIG. 3 illustrates a simplified schematic view of the sliding ring 150 and the edge ring 210 in FIG. 2A depicting a capacitive coupling configuration, according to one embodiment. As illustrated in FIG. 3, the edge ring 210 includes the ring body 216 and three conductive pins 292 protruding or extending from a bottom surface thereof. The sliding ring 150 includes three insert holes 154 for allowing the conductive pins 292 to pass through.

Figures 4A, 4B, 4C:
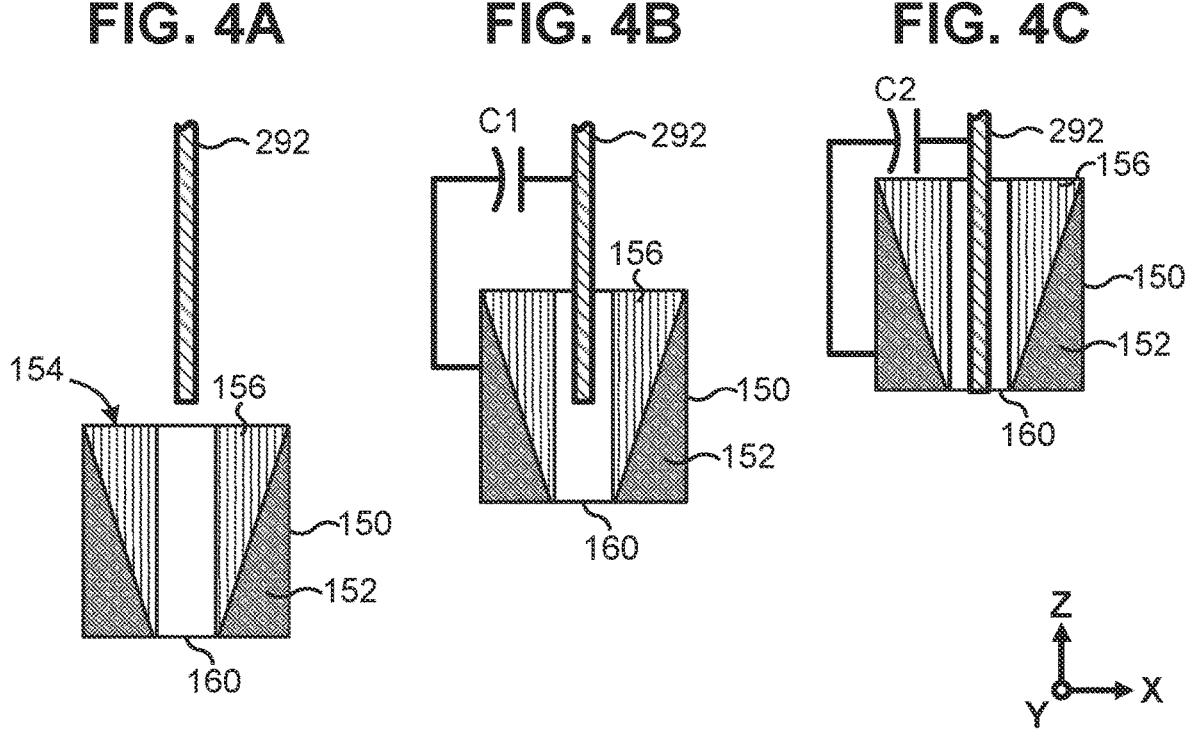
FIG. 4A illustrates a cross sectional view of the sliding ring and one of the conductive pins of the edge ring in the A-A plane in FIG. 3, in accordance with one embodiment of the present disclosure.
FIG. 4B illustrates another cross sectional view of the sliding ring and the conductive pin shown in FIG. 4A, in accordance with one embodiment of the present disclosure.
FIG. 4C illustrates another cross sectional view of the sliding ring and the conductive pin shown in FIG. 4A, in accordance with one embodiment of the present disclosure.

FIG. 4A illustrates a cross sectional view of the sliding ring 150 and one of the conductive pins 292 in the A-A plane in FIG. 3. As illustrated in FIG. 4A, the sliding ring 150 includes the insert hole 154, in which the dielectric insert 156 is received. In an example, the dielectric insert 156 is formed by coating the insert hole 154 with a ceramic material. A clearance through-hole 160 is formed in the center of the dielectric insert 156 and extends through the entire height of the dielectric insert 156 (as well as the entire height of the sliding ring 150). As shown in FIG. 4A, the sliding ring 150 is situated below the conductive pin 292 without any overlap along the z-axis. Thus, there is no capacitive coupling between the sliding electrode 152 and the conductive pin 292.

FIG. 4B illustrates another cross sectional view of the sliding ring 150 and the conductive pin 292 shown in FIG. 4A, where the sliding ring 150 is raised such that the conductive pin 292 is partially inserted in the clearance through-hole 160, according to one embodiment. When the sliding ring 150 is biased by a source power, as the sliding ring 150 and the conductive pin 292 are separated by the dielectric insert 156, the conductive pin 292 is capacitively coupled to the sliding electrode 152 with a capacitance $C_1$.

FIG. 4C illustrates another cross sectional view of the sliding ring 150 and the conductive pin 292 shown in FIG. 4A, where the sliding ring 150 is raised such that the conductive pin 292 is fully inserted in the clearance through-hole 160 along the z-axis, according to one embodiment.

When the sliding ring 150 is biased by a source power, as the sliding ring 150 and the conductive pin 292 are separated by the dielectric insert 156, the conductive pin 292 is capacitively coupled to the sliding electrode 152 with a capacitance $C_2$. As the amount of overlap between the sliding electrode 152 and the conductive pin 292 in FIG. 4C is greater than that in FIG. 4B, the capacitance $C_2$ is greater than the capacitance $C_1$ (i.e., $C_2 > C_1$).

Figures 5A, 5B:
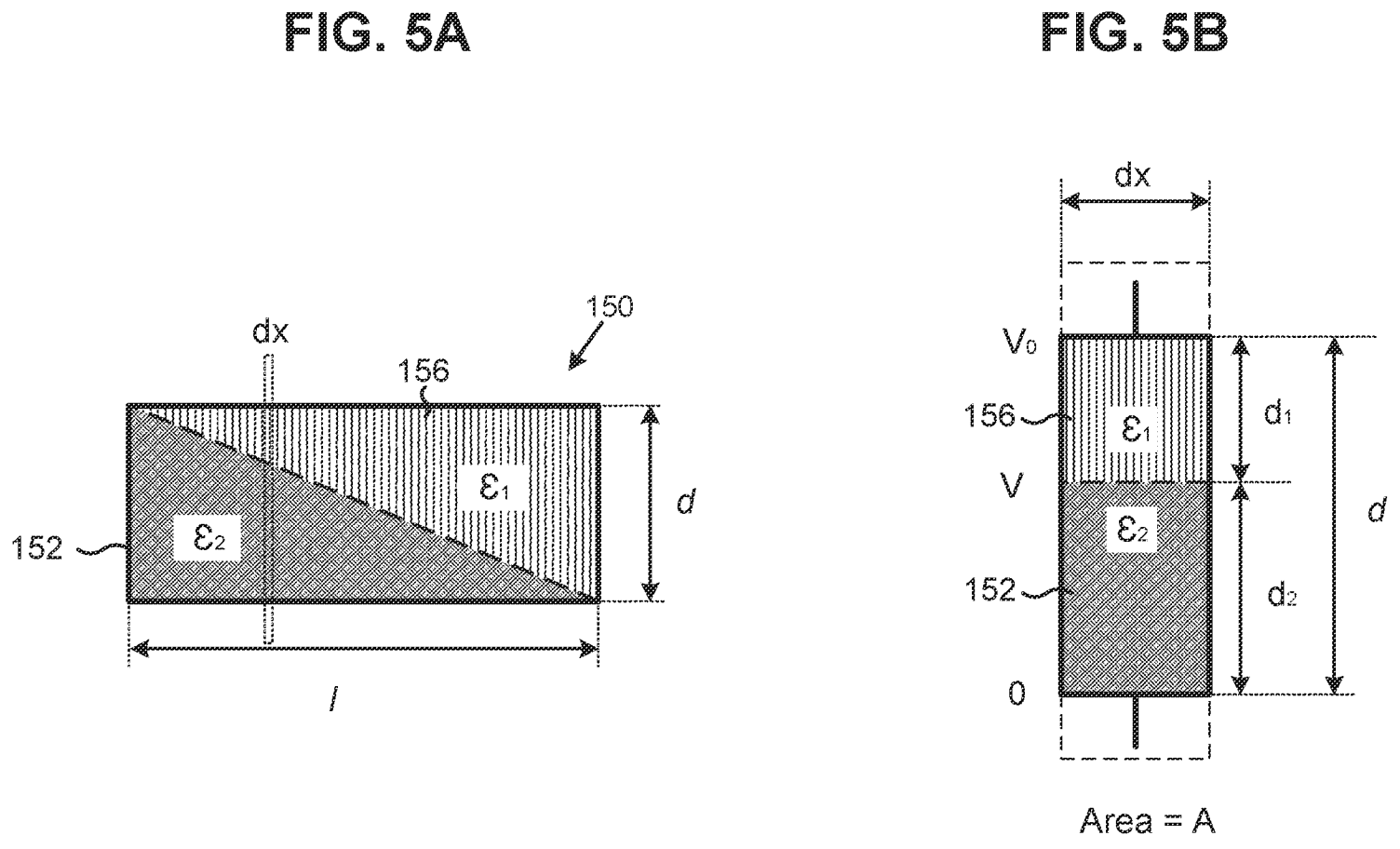

FIG. 5A illustrates a portion of the sliding ring 150 shown in FIGS. 2A-2C, according to one embodiment. As shown in FIG. 5A, the dielectric insert 156 includes a ceramic material having a permeability $\varepsilon_1$, and the sliding electrode 152 includes a conductive material having a permeability $\varepsilon_2$. As shown in FIG. 5B, for dx, the dielectric insert 156 has a thickness $d_1$, and the sliding electrode 152 has a thickness $d_2$. The thicknesses of the dielectrics are small so that the fields within them are uniform. There are effectively two capacitors in series having capacitance:

$$C_1 = \varepsilon_1 A / d_1 \qquad \text{Equation (2), and}$$

$$C_2 = \varepsilon_2 A / d_2 \qquad \text{Equation (3).}$$

The total capacitance is:

$$dC = \frac{\varepsilon_1 \times \varepsilon_2 \times A / \varepsilon_1 \times d_2 + \varepsilon_2 \times d_1 = \varepsilon_1 \times \varepsilon_2 \times dx / \varepsilon_1 \times (d-d_1) + \varepsilon_2 \times}{d_1} \qquad \text{Equation (3),}$$

$$d/l = dy/dx \qquad \text{Equation (4), and}$$

$$C = \int \varepsilon_1 \times \varepsilon_2 \times dx / \varepsilon_1 \times (d-d_y) + \varepsilon_2 \times d_y \qquad \text{Equation (5).}$$

It is noted that in the embodiment shown in FIGS. 2A-2C, 3, and 4A-4C, the dielectric insert 156 has an inverted conical shape with varying thicknesses at different depths, which advantageously increases the tuning resolution of the capacitive coupling between the sliding electrode 152 and the conductive pin 292 as sliding ring 150 moves up and down relative to the conducting pin 292. In another embodiment, the insert hole 154 and the dielectric insert 156 may have concentric cylindrical shapes, where the cylindrical dielectric insert 156 fits conformally in the cylindrical insert hole 154 in the sliding ring 150. In other embodiments, the insert hole 154 and the dielectric insert 156 may have any suitable shapes that can result in capacitive coupling between the sliding electrode 152 and the conductive pin 292.

Figure 6A:
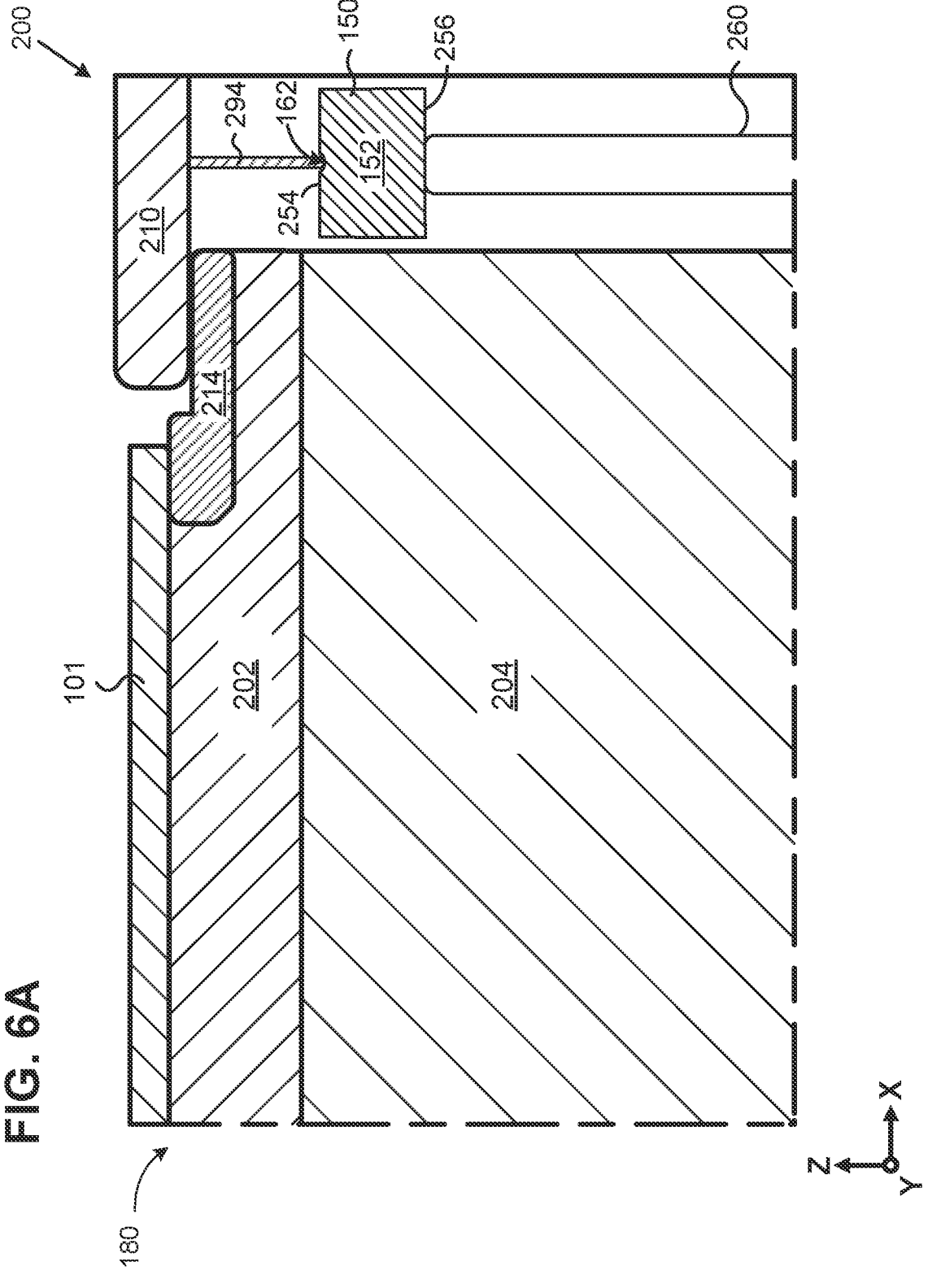
Figure 6B:
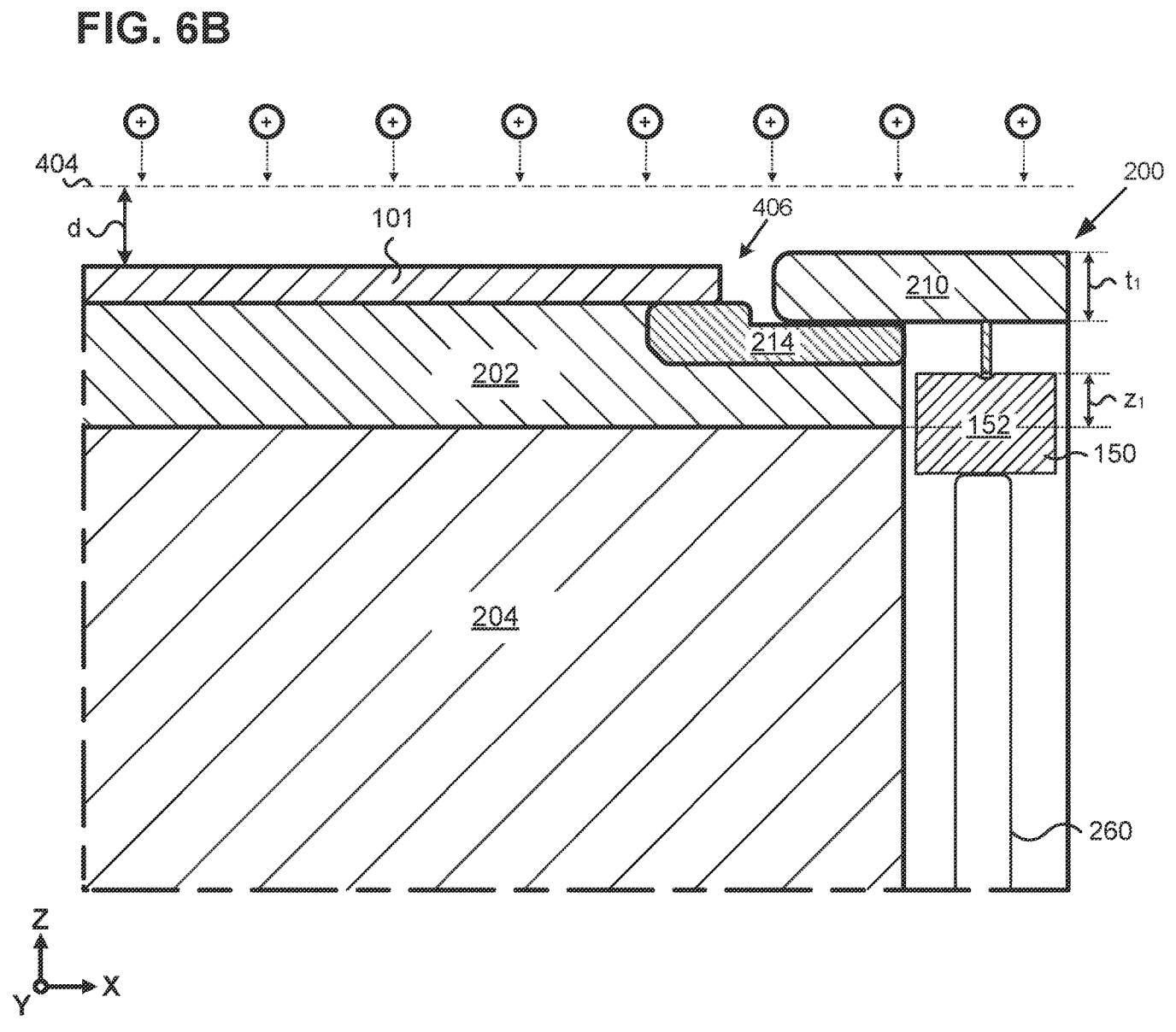
Figure 6C:
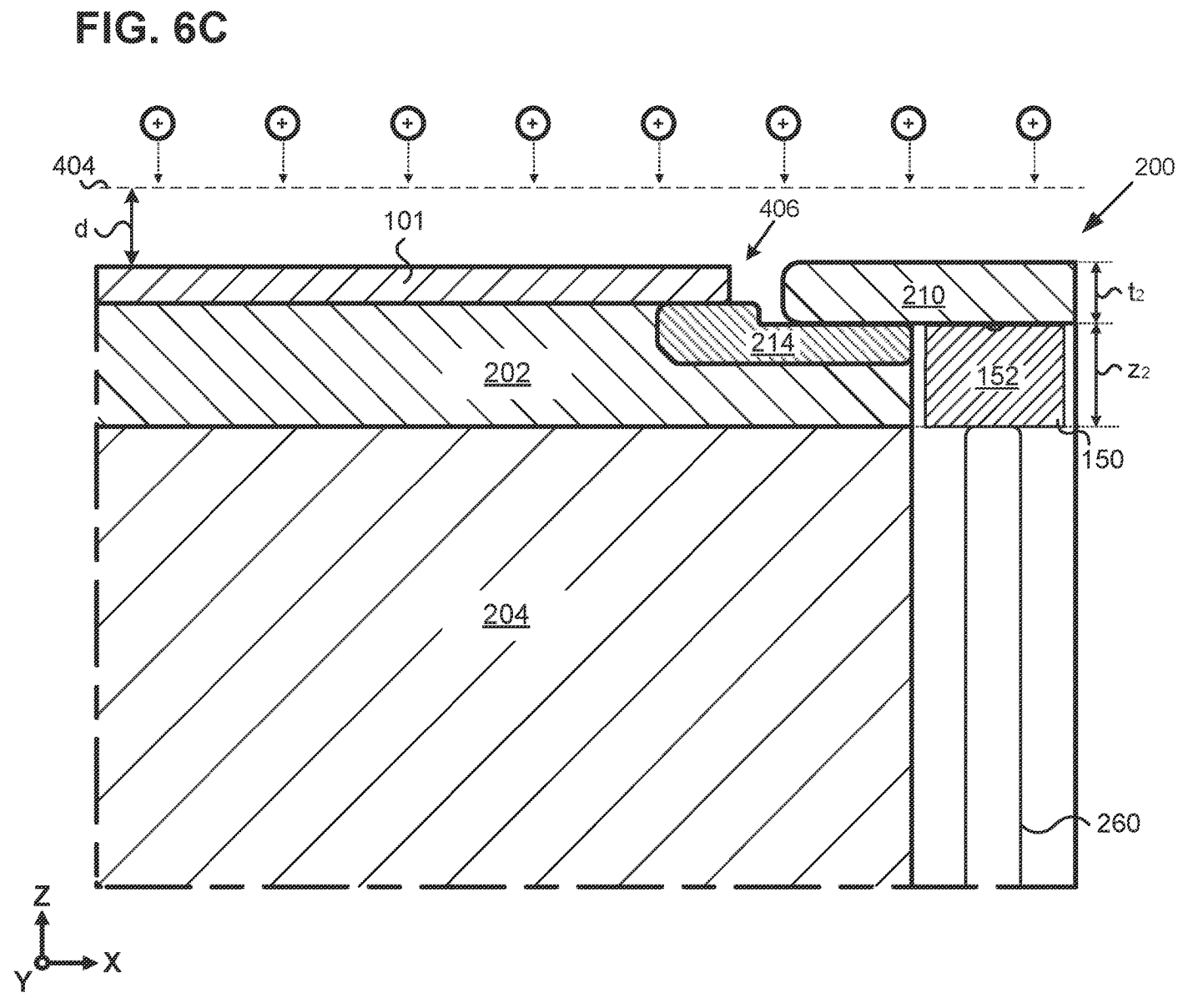

FIGS. 6A-6C illustrate simplified cross sectional views of a portion of the processing chamber of FIG. 1A depicting a capacitive coupling configuration between the substrate support 202 and sliding ring 150 (electrically connected to the edge ring 210) for tuning a voltage on the edge ring 210, according to one embodiment. In the present embodiment, the sliding ring 150 is electromechanically coupled to the edge ring 210, and is capacitively coupled to the substrate support 202. In one embodiment, the sliding ring 150 is physically separated from the substrate support 202, the cooling plate 204, and the base 206. The sliding ring 150 can be raised or lowered by one or more lift pins 260 driven by the actuating assembly 151 (shown in FIG. 1A).

In FIGS. 6A-6C, the substrate 101, the substrate support 202, the cooling plate 204, and the support ring 214 may substantially correspond to the substrate 101, the substrate support 202, the cooling plate 204, and the support ring 214, respectively, shown in FIGS. 2A-2C, the details of which are omitted for brevity.

As illustrated in FIG. 6A, the process kit 200 includes the edge ring 210, the support ring 214, and the sliding ring 150. The sliding ring 150 may include a sliding electrode 152 that includes a conductive material, such as a metal that can include aluminum, stainless steel, copper, nickel, or other suitable conductive material. The sliding ring 150 is electromechanically coupled to the edge ring 210 through one or more conductive coupling members 294 (e.g., arc segments, straps, flat springs, etc.). The sliding electrode 152 can be capacitively coupled to the bias electrode 104 (shown in FIG. 1A) in the substrate support 202, as the PV waveform generator 208A of the waveform generation assembly 208 (shown in FIG. 1A) is configured to bias the bias electrode 104.

As illustrated in FIGS. 6A-6C, the sliding ring 150 is situated beneath the edge ring 210, and may be raised and lowered along the z-axis, while the edge ring 210 remains stationary. In the present embodiment, the conductive coupling members 294 are configured to fall into a groove 162 on the top surface 254 of the sliding ring 150 when the sliding ring 150 is raised toward the edge ring 210. In some embodiments, the sliding ring 150 may be raised to make physical and electrical contact with the bottom surface of the edge ring 210. It should be noted that, in the present embodiment, the sliding ring 150 is electrically isolated from the substrate support assembly 180, and is not electrically connected to a source power (e.g., PV waveform provided from the PV waveform generator 208A and/or DC bias provided from the DC power source in the clamping network 209).

In some embodiments, the sliding ring 150 interfaces with the lift pin 260 at the bottom surface 256 of the sliding ring 150. For example, the lift pin 260 may be operably coupled with the sliding ring 150. The lift pin 260 is driven by the actuating assembly 151 (shown in FIG. 1A), which can include a pneumatic actuator or electric motor driven actuator assembly. In some embodiments, the lift pin 260 may be driven by a lift pin actuating mechanism (not shown) independent from the actuating assembly 151. The actuating assembly 151 allows the sliding ring 150 to be moved and positioned vertically within the processing chamber 100. The actuating assembly 151 raises the sliding ring 150 to one or more vertical positions that can be controlled by the system controller 126.

In another example, the sliding ring 150 may be moved manually, thus eliminating the need for the lift pin 260. The sliding ring 150 may include a cavity (not shown) and an access orifice formed therein. The cavity is formed down to a bottom of the sliding ring 150. The cavity is configured to house a lead screw (not shown). The lead screw may be turned to raise or lower the sliding ring 150 relative to the edge ring 210.

During substrate processing, a source power (e.g., PV waveform and/or bias provided from the clamping network 209) may be provided to the bias electrode 104 (shown in FIG. 1A) in the substrate support 202. The sliding ring 150 is capacitively coupled to the substrate support 202, when the sliding ring 150 moves along the z-axis to overlap with the substrate support 202 that is coupled to the source power.

As shown in FIG. 6A, the sliding ring 150 is situated beneath the substrate support 202, where the sliding ring 150 and the substrate support 202 do not overlap along the z-axis. In FIG. 6A, the sliding ring 150 is not capacitively coupled to the substrate support 202.

As shown in FIGS. 6B and 6C, the sliding ring 150 is raised to partially and fully, respectively, overlap with the substrate support 202. As a result of the overlap between the substrate support 202 and the sliding ring 150 along the z-axis, the sliding electrode 152 is capacitively coupled to the bias electrode 104. In one embodiment, the sliding ring 150 has a height substantially equal to the height of the substrate support 202. In another embodiment, the sliding ring 150 may have a height that is greater or less than the height of the substrate support 202.

By moving the sliding ring 150 along the z-axis relative to the substrate support 202, the amount of capacitive coupling between the sliding electrode 152 and the bias electrode 104 (shown in FIG. 1A) can be adjusted so as to tune the voltage on the edge ring 210, which in turn controls the plasma sheath 404 profile near the edge 406 of the substrate 101 to compensate for critical dimension nonuniformity. In other words, controlling the amount of capacitive coupling between the substrate support 202 and the sliding ring 150 (that is connected to the edge ring 210) affects the voltage on the edge ring 210, which in turn affects the thickness, d, of the plasma sheath 404.

The sheath thickness d of the plasma sheath 404 may be measured with respect to the edge ring 210. For example, in the embodiment shown in FIG. 6B, the sliding ring 150 is raised by the actuating assembly 151 (shown in FIG. 1A) along the z-axis such that the sliding ring 150 partially overlaps with the substrate support 202. The amount of overlap $z_1$ between the sliding ring 150 and the substrate support 202 results in the capacitive coupling between the substrate support 202 and the sliding ring 150. In FIG. 6B, with the overlap between the sliding ring 150 and the substrate support 202 being $z_1$, the voltage on the edge ring 210 is tuned to match the voltage on the substrate 101 (e.g., at $V_{DC}$). As illustrated in FIG. 6B, the plasma sheath 404 has a uniform thickness near the edge 406 of the substrate 101. It is noted that, in FIG. 6B, the edge ring 210 has an initial thickness $t_1$.

As shown in FIG. 6C, the thickness of the edge ring 210 is reduced to thickness $t_2$ from its initial thickness $t_1$ shown in FIG. 6B, for example, due to erosion during plasma etching in the processing chamber. The voltage on the edge ring 210 can change (e.g., decrease) when the edge ring 210 erodes. For example, due to erosion, the voltage on the edge ring 210 can fall below the voltage on the substrate 101 (e.g., below $V_{DC}$), which can in turn affect the profile of the plasma sheath 404 near the edge 406 of the substrate 101.

To compensate for the change in voltage on the edge ring 210 and/or to maintain plasma sheath thickness uniformity near the edge 406 of the substrate 101, as shown in FIG. 6C, the sliding ring 150 is raised by the actuating assembly 151 (shown in FIG. 1A) through the lift pin 260 along the z-axis such that the sliding ring 150 overlaps with the full height of the substrate support 202. The amount of overlap $z_2$ between the substrate support 202 and the sliding ring 150 results in an increased capacitive coupling between the two components as compared to the amount of capacitive coupling with overlap $z_1$ in FIG. 6B. The increased capacitive coupling tunes (e.g., increases) the voltage on the edge ring 210 to match the voltage on the substrate 101 (e.g., at $V_{DC}$). In other words, raising the sliding ring 150 increases the amount of capacitive coupling between the sliding electrode 152 and the bias electrode 104 (shown in FIG. 1A) so as to keep the voltage on the edge ring 210 equal to the voltage on the substrate 101, when the thickness of the sliding ring 150 is reduced, for example, due to etching. As illustrated in FIG. 6C, the profile of the plasma sheath 404 is kept uniform near the edge 406 of the substrate 101.

As shown in FIGS. 6A-6C, the capacitive coupling configuration can control and adjust the amount of capacitive coupling between the bias electrode 104 in the substrate support 202 and the sliding electrode 152 in the sliding ring 150 to tune the voltage on the edge ring 210, for example, to match the voltage on the substrate 101 (e.g., at $V_{DC}$).

Thus, the embodiment shown in FIGS. 6A-6C is able to achieve extreme edge sheath tunability without physically moving (e.g., raising or lowering) the edge ring 210. In other words, moving the sliding ring 150 relative to the substrate support 202 affects the profile of the plasma sheath 404 near the edge 406 of the substrate 101, which in turn controls the direction of the ions that are accelerated through the sheath and to the surface of the substrate 101.

In configurations where a constant potential (e.g., $V_{DC}$) is applied, the sheath thickness d and shape of the plasma sheath 404 remain constant throughout the plasma process. In configurations where the bias applied to the sliding ring 150 is pulsed, the sheath thickness d, which is controlled during the ion current phase of each pulse, is controlled so that the thickness and shape of the plasma sheath 404 remain constant throughout the primary etch portion of the PV waveform.

Figure 7:
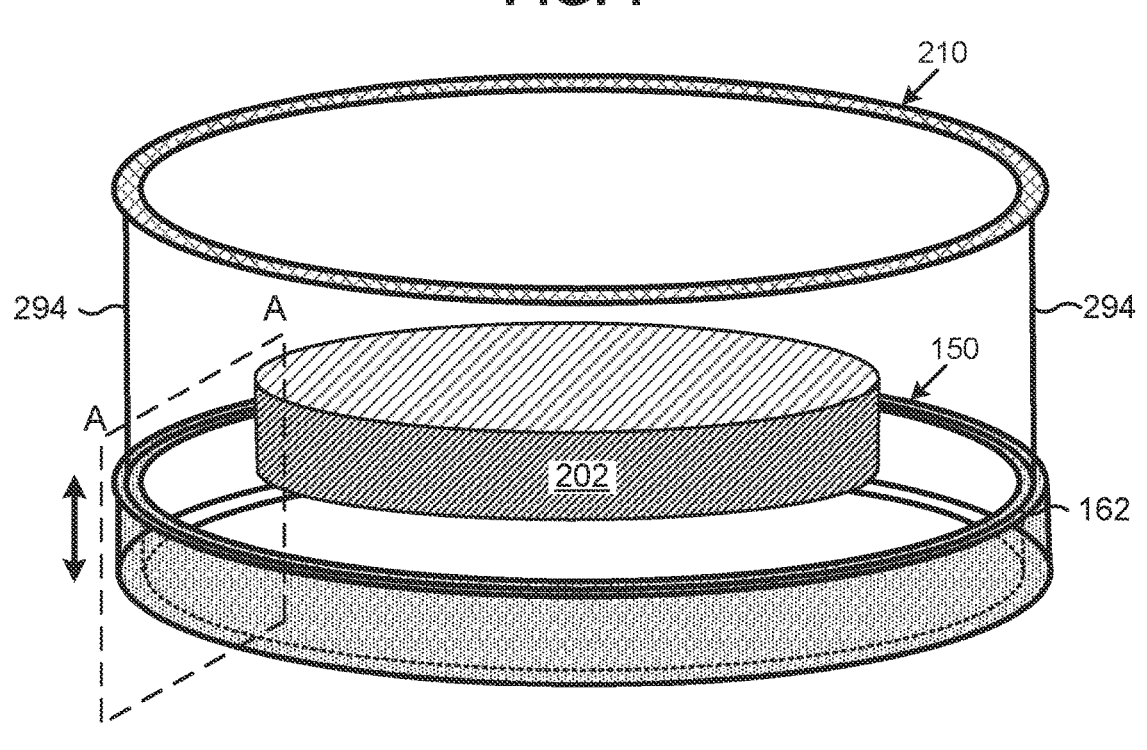
FIG. 7 illustrates a simplified schematic view of the sliding ring, the substrate support, and the edge ring in FIG. 6A, in accordance with one embodiment of the present disclosure.

FIG. 7 shows a simplified schematic view of the sliding ring 150, the substrate support 202, and the edge ring 210 in FIG. 6A depicting a capacitive coupling configuration, according to an embodiment. As illustrated in FIG. 7, the edge ring 210 and the substrate support 202 are stationary. The edge ring 210 is electromechanically coupled to the sliding ring 150 by two or more conductive coupling members 294 (e.g., straps). The sliding ring 150 is movable along the z-axis with respect to the substrate support 202 and the edge ring 210. As the sliding ring 150 is raised by the actuating assembly 151 (shown in FIG. 1A), the conductive coupling members 294 fall into a: groove 162 formed in the top surface of the sliding ring 150. The groove 162 follows the contour of the sliding ring 150.

Figure 8A:
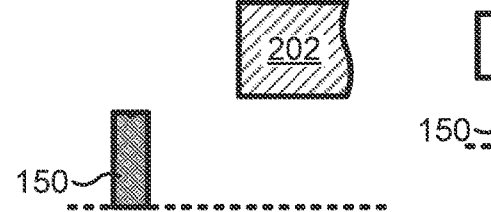
FIG. 8A illustrates a cross sectional view of the sliding ring and the substrate support in the A-A plane in FIG. 7, in accordance with one embodiment of the present disclosure.

FIG. 8A illustrates a cross sectional view of the sliding ring 150 and the substrate support 202 in the A-A plane in FIG. 7. As illustrated in FIG. 8A, the sliding ring 150 is situated beneath the substrate support 202 without any overlap along the z-axis. Thus, there is no capacitive coupling between the sliding ring 150 and the substrate support 202.

Figures 8B, 8C:
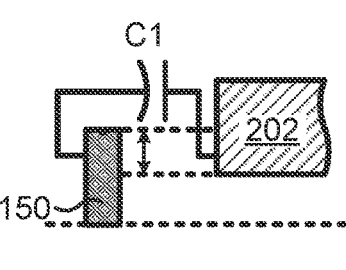
FIG. 8B illustrates another cross sectional view of the sliding ring and the substrate support shown in FIG. 4A, in accordance with one embodiment of the present disclosure.
FIG. 8C illustrates another cross sectional view of the sliding ring and the substrate support shown in FIG. 4A, in accordance with one embodiment of the present disclosure.

FIG. 8B illustrates another cross sectional view of the sliding ring 150 and the substrate support 202 shown in FIG. 8A, where the sliding ring 150 is raised such that the sliding ring 150 partially overlaps the substrate support 202 along the z-axis. When the substrate support 202 is biased by a source power, as the sliding ring 150 and the substrate support 202 are separated by a dielectric medium (e.g., air), the sliding ring 150 is capacitively coupled to the substrate support 202 with a capacitance $C_1$.

FIG. 8C illustrates another cross sectional view of the sliding ring 150 and the substrate support 202 shown in FIG. 4A, where the sliding ring 150 is raised such that the sliding ring 150 fully overlaps the substrate support 202 along the z-axis, according to one embodiment. When the substrate support 202 is biased by the source power, as the sliding ring 150 and the substrate support 202 are separated by a dielectric medium (e.g., air), the sliding ring 150 is capacitively coupled to the substrate support 202 with a capacitance $C_2$. As the amount of overlap between the sliding ring 150 and the substrate support 202 in FIG. 8C is greater than that in FIG. 8B, the capacitance $C_2$ is greater than the capacitance $C_1$ (i.e., $C_2>C_1$).

Figure 9A:
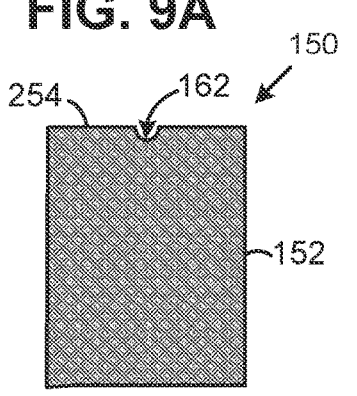
FIG. 9A illustrates an enlarged cross sectional view of the sliding ring shown in FIG. 7, in accordance with one embodiment of the present disclosure.

FIG. 9A shows a cross sectional view of the sliding ring 150 in FIG. 7 according to one embodiment. As shown in FIG. 9A, the sliding electrode 152 is made from a conductive material and has a substantially uniform thickness (e.g., along the x-axis). The sliding ring 150 includes a groove 162 in its top surface 254, where the groove 162 follows the contour of the sliding ring 150. As the sliding ring 150 is raised toward the edge ring 210, the conductive coupling members 294 fall into the groove 162 along the contour of the sliding ring 150.

Figure 9B:
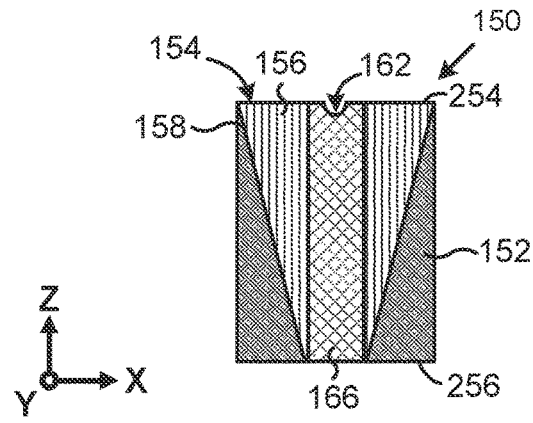
FIG. 9B illustrates an enlarged cross sectional view of the sliding ring shown in FIG. 7, in accordance with one embodiment of the present disclosure.

FIG. 9B shows a cross sectional view of the sliding ring 150 in FIG. 7 according to another embodiment. In the present embodiment, the sliding ring 150 has one or more insert holes 154 that extend from the top surface 254 to the bottom surface 256 of the sliding ring 150. Each insert hole 154 is recessed from the top surface 254, and includes an inner sidewall 158, tapered toward the bottom surface 256, for receiving a dielectric insert 156. Each dielectric insert 156 has an inverted conical shape that conforms to the tapered inner sidewall 158 of the insert hole 154. In one example, the dielectric inserts 156 can be formed by coating the insert holes 154 with a ceramic material. A conductive core 166 is formed in a through-hole in the center of the dielectric insert 156 and extends through the entire height (e.g., along the z-axis) of the dielectric insert 156. The tapered inner sidewalls 158 of the insert holes 154 allow the dielectric inserts 156 to have varying thicknesses at different depths. As a result, the capacitive coupling between the substrate support 202 and the sliding ring 150 can be tuned with high precision given the varying dielectric thicknesses at different depths. As shown in FIG. 9B, the sliding ring 150 includes the groove 162 in its top surface 254, where the groove 162 follows the contour of the sliding ring 150. As the sliding ring 150 is raised toward the edge ring 210, the conductive coupling members 294 fall into the groove 162 along the contour of the sliding ring 150.

Figure 10:
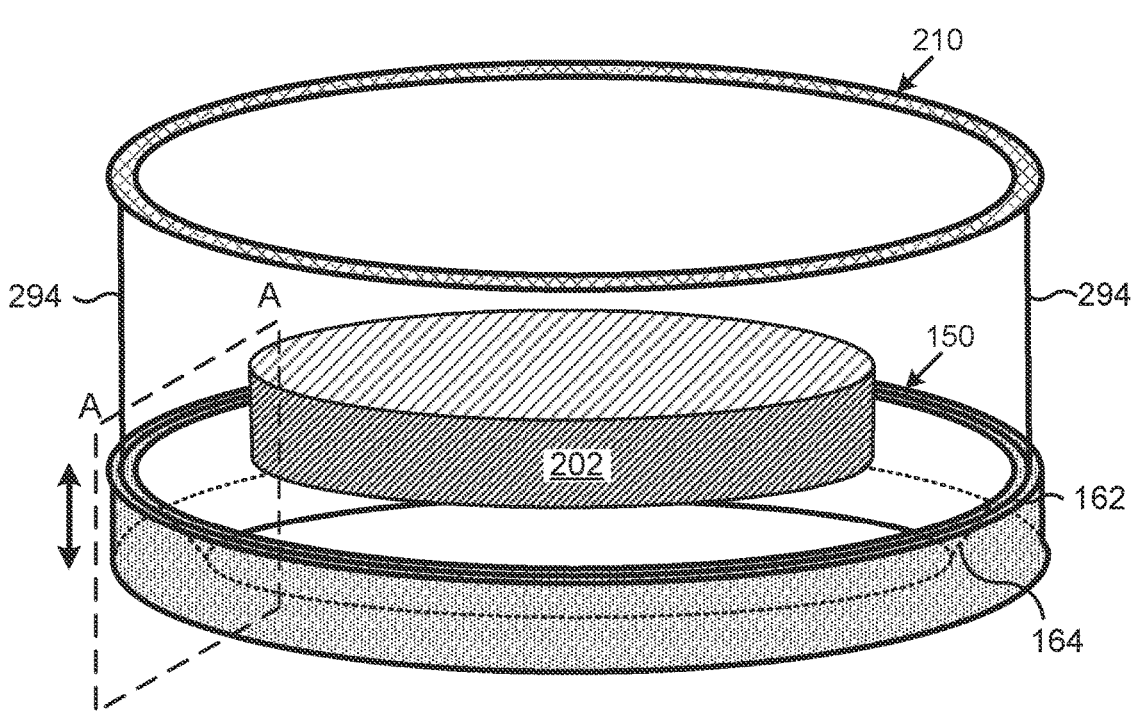
FIG. 10 illustrates a simplified schematic view of the sliding ring, the substrate support, and the edge ring in FIG. 6A, in accordance with one embodiment of the present disclosure.

FIG. 10 shows a simplified schematic view of another capacitive coupling configuration, according to another embodiment. The substrate support 202, the edge ring 210, and the conductive coupling members 294 in FIG. 10 may substantially correspond to the substrate support 202, the edge ring 210, and the conductive coupling members 294 in FIG. 7, respectively, the details of which are omitted for brevity. Different from FIG. 7, the sliding ring 150 in FIG. 10 has a tapered inner sidewall 164. The sliding ring 150 with the tapered inner sidewall 164 can advantageously increase the tuning resolution of the capacitive coupling between the sliding ring 150 and the substrate support 202 as sliding ring 150 moves up and down along the z-axis relative to the substrate support 202.

Figures 11A, 11B, 11C:
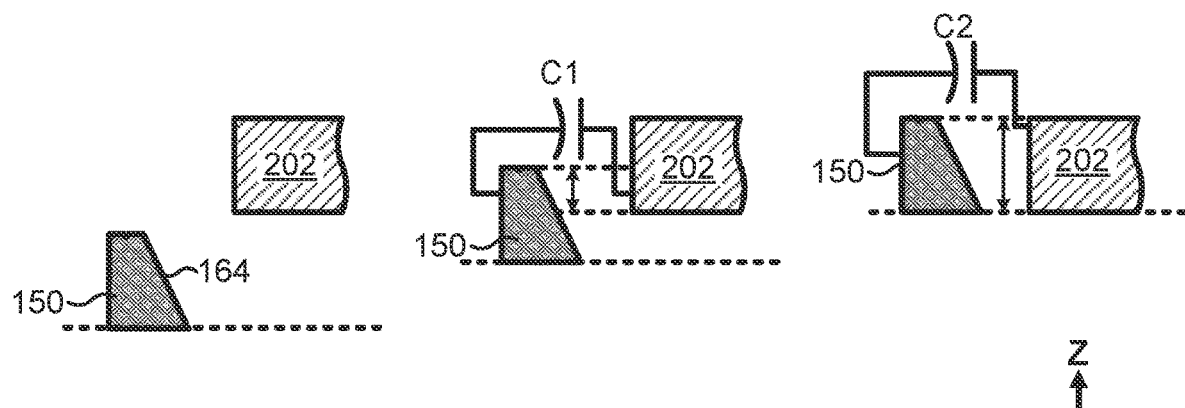
FIG. 11A illustrates a cross sectional view of the sliding ring and the substrate support in the A-A plane in FIG. 10, in accordance with one embodiment of the present disclosure.
FIG. 11B illustrates another cross sectional view of the sliding ring and the substrate support shown in FIG. 11A, in accordance with one embodiment of the present disclosure.
FIG. 11C illustrates another cross sectional view of the sliding ring and the substrate support shown in FIG. 11A, in accordance with one embodiment of the present disclosure.

FIG. 11A illustrates a cross sectional view of the sliding ring 150 and the substrate support 202 in the A-A plane in FIG. 10. As illustrated in FIG. 11A, the sliding ring 150 has the tapered inner sidewall 164. In FIG. 11A, the sliding ring 150 is situated beneath the substrate support 202 without any overlap along the z-axis. Thus, there is no capacitive coupling between the sliding ring 150 and the substrate support 202.

FIG. 11B illustrates another cross sectional view of the sliding ring 150 and the substrate support 202 shown in FIG. 11A, where the sliding ring 150 is raised such that the sliding ring 150 partially overlaps the substrate support 202 along the z-axis. When the substrate support 202 is biased by a source power, as the sliding ring 150 and the substrate support 202 are separated by a dielectric medium (e.g., air), the sliding ring 150 is capacitively coupled to the substrate support 202 with a capacitance $C_1$.

FIG. 11C illustrates another cross sectional view of the sliding ring 150 and the substrate support 202 shown in FIG. 11A, where the sliding ring 150 is raised such that the sliding ring 150 fully overlaps the substrate support 202 along the z-axis, according to one embodiment. When the substrate support 202 is biased by the source power, as the sliding ring 150 and the substrate support 202 are separated by a dielectric medium (e.g., air), the sliding ring 150 is capacitively coupled to the substrate support 202 with a capacitance $C_2$. As the amount of overlap between the sliding ring 150 and the substrate support 202 in FIG. 11C is greater than that in FIG. 11B, the capacitance $C_2$ is greater than the capacitance $C_1$ (i.e., $C_2 > C_1$).

FIG. 12A illustrates a schematic view of a conductive coupling member for electromechanically connecting a sliding ring to an edge ring, according to one embodiment. As shown in FIG. 12A, the coupling member 630 includes a body 633 formed from a conductive material. The body 633 includes a first end 631 connected to a second end 632 through a mid-section 655. The body 633 further includes attachment points 620 on the first end 631 and the second end 632. The attachment points 620 may be holes suitable for fasteners. In one example, the attachment points 620 are through holes suitable for a bolt type fastener. In another example, the attachment points 620 are threaded holes suitable for accepting a screw type fastener. In yet other examples, the attachment points 620 may alternately be a weld to the coupling member 630. It should be appreciated that the attachment points 620 may be any suitable mechanism which facilitates an electromechanical coupling, for example, between the coupling member 630 and the sliding ring 150 and between the coupling member 630 and the edge ring 210. It is noted that, in the embodiment shown in FIG. 12A, the coupling member 630 includes a stepped surface. In another embodiment, the stepped surface may be optional such that the coupling member 630 includes a flat body (e.g., a flat spring).

FIG. 12B illustrates a schematic diagram of the conductive coupling member in FIG. 12A electromechanically coupled to a sliding ring and an edge ring, according to one embodiment. As shown in FIG. 12B, the coupling member 630 is electromechanically attached to the sliding ring 150 at the first attachment location 641 on the first end 631 by fasteners 646. For example, the sliding ring 150 may have one or more holes which align with the attachment points 620 at the first attachment location 641. A bolt, screw, rivet, weld or other suitable fastener may extend through each of the attachment points 620 and the holes in the sliding ring 150 for electromechanically coupling the first end 631 of the coupling member 630 to the sliding ring 150.

As shown in FIG. 12B, the coupling member 630 is attached to the edge ring 210 at the second attachment location 642 on the second end 632 by fasteners 648. In one embodiment, the edge ring 210 includes a lower edge ring 210A and an upper edge ring 210B situated on top of the lower edge ring 210A. The lower edge ring 210A may be coupled to or engaged with the upper edge ring 210B by a conductive adhesive or any suitable mechanism. The upper edge ring 210B is made from SiC or other suitable conductive materials. The lower edge ring 210A is made from a conductive material that can provide a strong retention force to keep the coupling member 630 secured to the edge ring 210 through the fasteners 648. For example, the lower edge ring 210A may have one or more holes which align with the attachment points 620 at the second attachment location 642. A bolt, screw, rivet, weld or other suitable fastener may extend through each of the attachment points 620 and the holes in lower edge ring 210A for electromechanically coupling the second end 632 of the coupling member 630 to the edge ring 210. In another embodiment, the lower edge ring 210A may be optional such that the coupling member 630 is attached to the upper edge ring 210B through the fasteners 648.

The coupling member 630 is configured to allow movement of the sliding ring 150 relative to the edge ring 210. For example, the mid-section 655 of the body 633 is configured to elastically deform while maintaining mechanical and electrical connectivity between the first and second ends 631 and 632 of the body 633. For example, the mid-section 655 may be a thin sheet metal plate. Alternatively, the mid-section 655 may be a wire. The mid-section 655 is configured to permit the first end 631 of the body 633 to move relative to the second end 632 of the body 633. For example, the mid-section 655 may deflect or bend when the sliding ring 150 is displaced vertically.

The coupling member 630 may be formed from an aluminum material. In some embodiments, the coupling member 630 may be uncoated to ensure good electrical conductivity throughout the life of the coupling member 630. In some embodiments, the sliding ring 150 is formed from aluminum. The sliding ring 150 may be anodized along the top surface 254. The sliding ring 150 may additionally be yttria coated with the anodization along the top surface 254. The coupling member 630 is electrically connected to the sliding ring 150 through screws or other suitable fasteners.

FIG. 12C illustrates a top plan view of the coupling member 630 positioned on the top surface 254 of the sliding ring 150 shown in FIG. 12B, according to an embodiment. As shown in FIG. 12C, the coupling member 630 is situated on the top surface 254 of the sliding ring 150, and has an arc shape that follows the contour of the sliding ring 150, as seen in the top plan view. As the sliding ring 150 is raised toward the edge ring 210, the coupling member 630 falls on the top surface 254 along the contour of the sliding ring 150.

FIG. 13 illustrates a flowchart of a method 1300 for processing a substrate, according to one embodiment. As illustrated in FIG. 13, block 1302 includes positioning the substrate on a substrate support disposed in a substrate processing chamber, wherein the substrate is circumscribed by an edge ring as shown in FIG. 1A. Block 1304 includes forming a plasma above the substrate as shown in FIG. 1A. Block 1306 includes tuning a voltage on the edge ring by displacing a sliding ring along a direction that changes an amount of capacitive coupling between the edge ring and a cathode of a power source to control a plasma sheath near an edge of the substrate. According to some embodiments, the capacitive coupling between the edge ring and the cathode may be between the sliding ring 150 and the conductive pins 292 (connected to the edge ring 210), where the sliding ring 150 is electrically coupled to the cathode, as shown and described with reference to FIGS. 2A-2C, 3, and 4A-4C above. According to some embodiments, the capacitive coupling between the edge ring and the cathode may be between the sliding ring 150 (connected to the edge ring 210) and the substrate support 202, where the substrate support 202 is electrically coupled to the cathode, as shown and described with reference to FIGS. 6A-6C, 7, 8A-8C, 9A-9B, 10, 11A-11C, and 12A-12C above. In some embodiments, a single output DC pulsed voltage bias source can be used to bias the voltage on the substrate as well as to capacitively bias the voltage on the edge ring. According to the embodiments, the capacitive coupling can be adjusted while the edge ring stays stationary, thereby substantially eliminating particle generation issues.

While the foregoing is directed to specific embodiments, other and further embodiments may be devised without departing from the basic scope-thereof, and the scope thereof is determined by the claims that follow.

What is claimed is:

1. A process kit for a substrate processing chamber, the process kit comprising:

an edge ring configured to circumscribe a substrate in the semiconductor processing chamber;

at least one conductive pin electrically coupled to the edge ring;

a sliding ring positioned beneath the edge ring and comprising at least one insert hole for receiving the at least one conductive pin;

an actuator operable to displace the sliding ring relative to the at least one conductive pin along a direction that changes an amount of capacitive coupling between the at least one conductive pin and the sliding ring; and a dielectric insert positioned in the at least one insert hole.

2. The process kit of claim 1, wherein:

the dielectric insert has a through-hole; and the at least one conductive pin is operable to extend into the through-hole formed in the dielectric insert.

3. The process kit of claim 1, wherein:

the at least one insert hole has a tapered inner sidewall; and the dielectric insert has an inverted conical shape and fits conformally along the tapered inner sidewall.

4. The process kit of claim 1, wherein the at least one conductive pin protrudes from a bottom surface of the edge ring.

5. The process kit of claim 1, wherein the edge ring is stationary in the substrate processing chamber relative to the displacement of the sliding ring.

6. The process kit of claim 1, further comprising:

a power coupling mechanism operable to electromechanically couple the sliding ring to a cathode of a DC power source.

7. The process kit of claim 1, wherein, when the sliding ring is electrically coupled to a power source, a voltage on the edge ring is adjusted by changing the amount of capacitive coupling between the at least one conductive pin and the sliding ring to control a plasma sheath near an edge of the substrate.

8. A process kit for a substrate processing chamber, the process kit comprising:

an edge ring configured to circumscribe a substrate in the semiconductor processing chamber;

a sliding ring positioned beneath the edge ring and electromechanically coupled to the edge ring through at least one coupling member; and an actuator operable to displace the sliding ring along a direction that changes an amount of capacitive coupling between the sliding ring and a baseplate supporting the substrate, wherein the sliding ring and the baseplate are separated by a dielectric material.

9. The process kit of claim 8, wherein the sliding ring has a tapered inner sidewall.

10. The process kit of claim 8, wherein the edge ring is stationary in the substrate processing chamber.

11. The process kit of claim 8, wherein:

the sliding ring comprises at least one insert hole for receiving a dielectric insert, and a conductive core positioned in the dielectric insert; and the conductive core is electromechanically coupled to the at least one coupling member.

12. The process kit of claim 11, wherein:

the at least one insert hole has a tapered inner sidewall; and the dielectric insert has an inverted conical shape and fits conformally along the tapered inner sidewall.

13. The process kit of claim 8, wherein the at least one coupling member is configured to be fastened to a top surface of the sliding ring.

14. The process kit of claim 8, wherein the at least one coupling member is configured to be fastened to a bottom surface of the edge ring.

15. The process kit of claim 8, wherein the at least one coupling member is contoured along a top surface of the sliding ring.

16. The process kit of claim 8, wherein:

the edge ring includes a lower edge ring and an upper edge ring situated on the lower edge ring; and the at least one coupling member electromechanically connects the sliding ring to the lower edge ring.

17. The process kit of claim 8, wherein the at least one coupling member includes one of an arc segment, a strap, and a flat spring.

18. The process kit of claim 8, wherein, when the baseplate is electrically coupled to a cathode providing DC power, a voltage on the edge ring is adjusted by changing the amount of capacitive coupling between the baseplate and the sliding ring to control a plasma sheath near an edge of the substrate.

19. A process kit for a substrate processing chamber, the process kit comprising:

an edge ring configured to circumscribe a substrate in the semiconductor processing chamber;

a sliding ring positioned beneath the edge ring and electromechanically coupled to the edge ring through at least one coupling member; and an actuator operable to displace the sliding ring along a direction that changes an amount of capacitive coupling between the sliding ring and a baseplate supporting the substrate, the sliding ring having a tapered inner sidewall.

* * * * *